US006936831B2

(12) United States Patent
Fujiwara et al.

(10) Patent No.: US 6,936,831 B2
(45) Date of Patent: Aug. 30, 2005

(54) DIVIDED RETICLES FOR CHARGED-PARTICLE-BEAM MICROLITHOGRAPHY APPARATUS, AND METHODS FOR USING SAME

(75) Inventors: Tomoharu Fujiwara, Ageo (JP); Noriyuki Hirayanagi, Tokyo (JP); Kazuaki Suzuki, Tokyo (JP); Teruaki Okino, Kamakura (JP)

(73) Assignee: Nikon Corporation, Tokyo (JP)

( * ) Notice: Subject to any disclaimer, the term of this patent is extended or adjusted under 35 U.S.C. 154(b) by 180 days.

(21) Appl. No.: 09/860,958

(22) Filed: May 17, 2001

(65) Prior Publication Data

US 2001/0046631 A1 Nov. 29, 2001

(30) Foreign Application Priority Data

May 19, 2000 (JP) ........................................ 2000-147352

(51) Int. Cl.[7] ............................ H01J 37/00; H01L 21/30
(52) U.S. Cl. ................................ 250/492.1; 250/492.2; 250/491.1; 250/398; 430/5; 430/290; 430/325; 430/326; 437/229; 437/250
(58) Field of Search .......................... 250/492.1, 492.2, 250/492.21, 492.22, 492.3, 491.1, 398, 397; 430/5, 296, 326, 311, 323, 30, 942; 437/229, 230; 378/35; 364/525; 395/500

(56) References Cited

U.S. PATENT DOCUMENTS

| | | | | | |
|---|---|---|---|---|---|
| 4,282,437 A | * | 8/1981 | Boie | ........................ | 250/492.2 |
| 4,607,167 A | * | 8/1986 | Petric | ...................... | 250/492.2 |
| 4,742,234 A | * | 5/1988 | Feldman et al. | .......... | 250/492.2 |
| 4,812,661 A | * | 3/1989 | Owen | ...................... | 250/491.1 |
| 5,674,413 A | * | 10/1997 | Pfeiffer et al. | ......... | 219/121.25 |
| 5,874,198 A | * | 2/1999 | Okino | ......................... | 430/296 |
| 6,023,068 A | * | 2/2000 | Takahashi | ................ | 250/492.2 |
| 6,147,355 A | * | 11/2000 | Ando et al. | .............. | 250/492.2 |

* cited by examiner

Primary Examiner—John R. Lee
Assistant Examiner—David A. Vanore
(74) Attorney, Agent, or Firm—Klarquist Sparkman, LLP

(57) ABSTRACT

Reticles and apparatus for performing charged-particle-beam microlithography, and associated methods, are disclosed, in which the pattern to be transferred to a sensitive substrate is divided according to any of various schemes serving to improve throughput and pattern-transfer accuracy. The methods and apparatus are especially useful whenever a divided stencil reticle is used that includes complementary pattern portions.

18 Claims, 12 Drawing Sheets

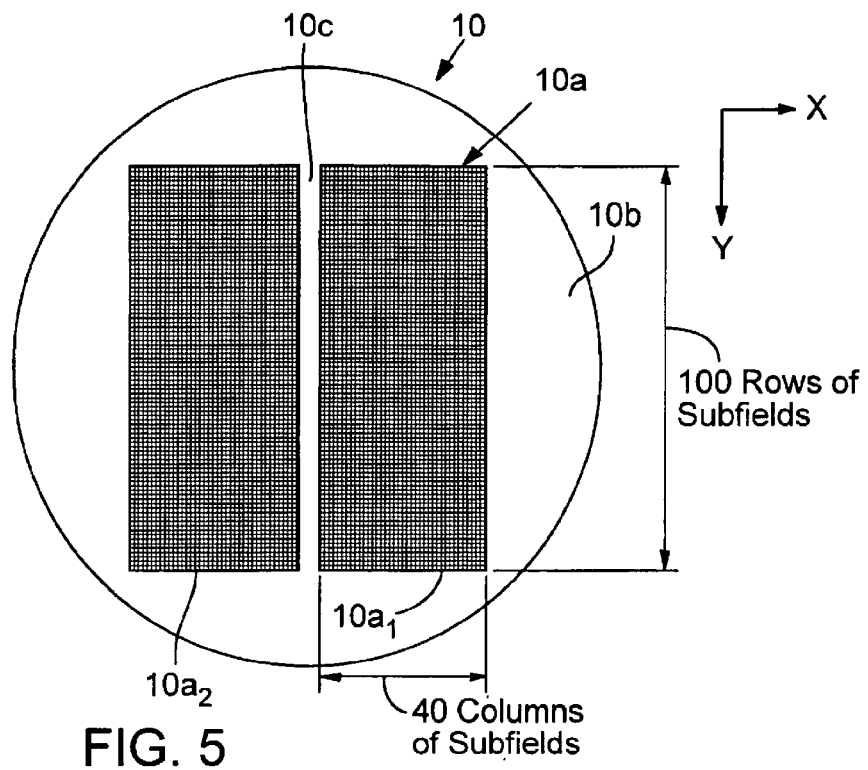
FIG. 5
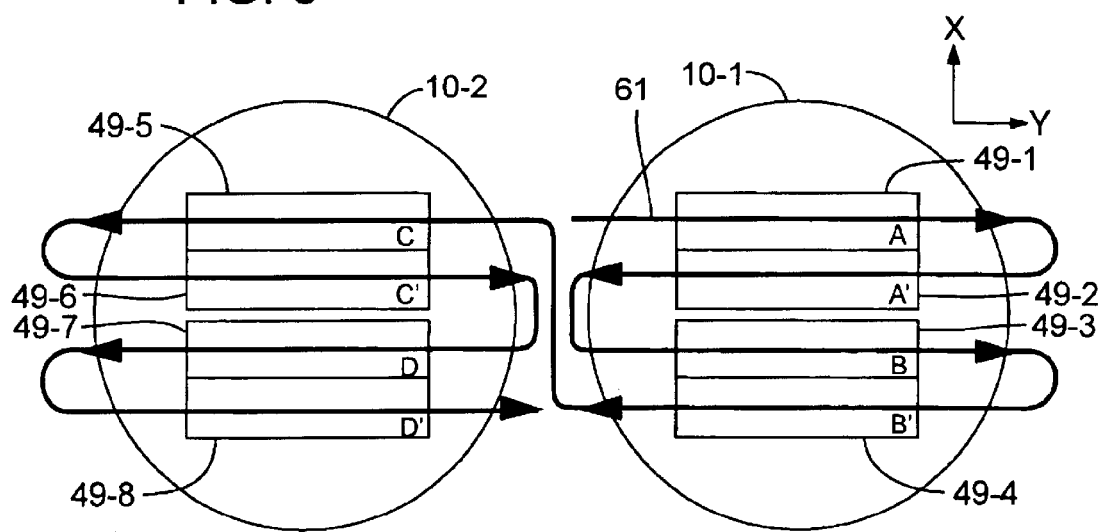
FIG. 6
FIG. 7

DIVIDED RETICLES FOR CHARGED-PARTICLE-BEAM MICROLITHOGRAPHY APPARATUS, AND METHODS FOR USING SAME

FIELD OF THE INVENTION

This invention pertains to microlithography (projection-transfer of a pattern, defined by a reticle or mask, onto a sensitive substrate) using a charged particle beam such as an electron beam or ion beam. Microlithography is a key technique used in the manufacture of microelectronic devices such as semiconductor integrated circuits, displays, thin-film magnetic pickup heads, and micromachines. More specifically, the invention pertains to reticles, and methods and apparatus for their use, that provide more accurate pattern transfer, especially of patterns having complementary portions.

BACKGROUND OF THE INVENTION

In recent years, the degree of integration of semiconductor integrated circuits and other microelectronic devices has continued to increase, with concomitant increases in the intricacy and complexity of their circuit patterns. Increased complexity typically means more layers, larger layers, and smaller circuit elements that must be formed in each layer. Hence, overlay of successive layers relative to previously applied layers must be performed with correspondingly greater accuracy.

Conventionally, optical steppers are employed mainly for performing microlithography aspects of wafer processing in the manufacture of semiconductor integrated circuits. In optical microlithography, the reticle normally is produced by direct-writing using an electron beam. An advantage of optical microlithography is the ability to expose an entire reticle pattern in one exposure ("shot"), which typically provides excellent "throughput" (number of wafers that can be exposed with a pattern per unit time).

Unfortunately, optical microlithography currently is limited by the diffraction of light from providing ever-increasing pattern resolution. This has provided the impetus to find and develop alternative microlithography techniques that can provide higher resolution. An attractive candidate alternative technique is microlithography performed using a charged particle beam such as an electron beam or ion beam. Charged-particle-beam (CPB) microlithography offers prospects of better resolution for reasons similar to the substantially improved resolution obtained with electron microscopy compared to optical microscopy.

A disadvantage of CPB microlithography is lower throughput than normally obtained with optical microlithography. Various approaches have been investigated to find a practical CPB microlithography technique with acceptable throughput. Certain techniques that have received attention include the "partial-pattern-block" exposure techniques, including "cell projection," "character projection," and "block exposure." Partial-pattern-block exposure techniques are employed especially for patterns in which a basic unit, such as a memory cell, is repeated a large number of times. For example, for a DRAM, the basic unit can have dimensions of approximately 5-$\mu$m square on the substrate. The reticle usually defines multiple basic units that are transfer-exposed repeatedly and separately using an electron beam. Not only is substantial time required to form an entire pattern on the wafer in this manner, but also portions of the pattern that are not highly repeated typically must be exposed using another technique such as "variable-shaped beam" direct writing. Consequently, throughput obtained with these techniques is too low for large-scale mass-production of integrated circuits.

An approach offering prospects of substantially improved throughput compared to partial pattern block exposure involves exposure of an entire reticle pattern (or even multiple reticles) in one "shot," similar to optical microlithography. The general idea is to expose the reticle with "reduction" (demagnification), meaning that the pattern image as formed on the substrate is smaller than the pattern as defined on the reticle. Unfortunately, this approach has not been realized from a practical standpoint. First, it has been impossible to date to produce a reticle that can be exposed in a single shot of a charged particle beam. Second, this approach requires an extremely large CPB-optical system. It has been impossible to date, using such large CPB lenses and deflectors, to achieve satisfactory correction of aberrations, especially off-axis aberrations.

In view of the problems inherent in the approaches summarized above, yet another approach has been the subject of extensive investigation. This approach is termed the "divided-reticle" approach, in which the reticle pattern is divided into multiple exposure units typically called "subfields" each defining a respective portion of the overall pattern. The subfields are exposed individually and in a particular exposure order, with demagnification. The subfield images are formed on the substrate in locations that result in all the images being "stitched" together properly and in a contiguous manner so as to form the entire pattern. Even though the throughput obtained with the divided-reticle approach is not as high as with the full-reticle exposure technique, the throughput is substantially better than obtained with the partial-pattern-block exposure technique. Furthermore, each subfield can be imaged with high accuracy and with excellent correction of aberration and of errors of magnification and image position on the substrate. On the reticle, the subfields typically are arranged in a rectilinear array of rows and columns of subfields that are exposed subfield-by-subfield in each row and row-by-row. As each subfield in a row is exposed, the charged particle beam is deflected in a lateral direction as required, within the optical field of the CPB-optical system. Progressing from one row to the next is accomplished by appropriate movements of the reticle and substrate.

Reticles usable in CPB microlithography typically are of two types: stencil reticles and membrane reticles. A stencil reticle comprises a relatively thick CPB-scattering membrane, wherein the pattern elements are defined by a corresponding pattern of through-holes in the membrane. Whereas charged particles of an incident "illumination beam" are scattered as they pass through the membrane, charged particles of the illumination beam incident on a through-hole pass with little to no scattering through the through-hole. A membrane reticle comprises a relatively thin CPB-transmissive membrane, wherein the pattern elements are defined by a correspondingly patterned scattering layer formed on the CPB-transmissive membrane. Whereas charged particles of an illumination beam incident on a region of the reticle lacking any of the scattering layer pass through the membrane with little to no scattering, charged particles are highly scattered if incident on a region of the scattering layer.

One difficulty with a stencil reticle is the so-called "donut problem," characterized by a pattern element that must be defined by a through-hole surrounding a portion of the reticle membrane. The problem is that a stencil reticle provides no way in which to provide physical support for the surrounded portion of the reticle membrane. To achieve exposure of a "donut" pattern element, either two separate portions of the same reticle, or two separate reticles, must be used, each defining a portion of the "donut" while providing support for the surrounded portion of the membrane. The two reticle portions needed to achieve full exposure of the "donut" element are termed "complementary." This scheme is depicted in FIGS. 21(A)–21 (B). In FIG. 21(A), a "donut" pattern element 101 is shown. To achieve full exposure of the donut pattern element 101, the element is divided into a first portion 103 and a second portion 104 that must be exposed separately. Hence, two exposures are required to expose the entire donut element 101 onto the substrate.

More specifically, FIG. 21(A) shows the donut pattern element 101 needing to be defined by a respective through-hole on a stencil reticle. If defined on a single region of a reticle, this would result in a ring-shaped through-hole 102R surrounding an unsupported island region 102C that is not exposed on the reticle. The donut pattern element 101 simply cannot be defined on a single region of a stencil reticle because the region of the stencil reticle provides no way in which to support the island portion 102 surrounded by the ring-shaped through-hole 102R. Hence, the donut pattern element 101 is divided along the line 100 into laterally symmetrical complementary elements 103, 104 that are defined by different subfields on the same reticle or on separate reticles. Transfer of the complete donut pattern element 101 requires two exposures. Also, exposure must be performed with sufficient accuracy ensuring that the images of the two portions 103, 104 are "stitched" together properly on the substrate.

FIG. 21(B) depicts use of a complementary reticle to help define a long linear pattern element 105. The pattern element 105 is divided into segments 108, 110 that are defined on a first region of the reticle (or on a first reticle) and a segment 109 that is defined on a second region of the reticle (or on a separate, second reticle). This manner of division typically is used for extremely long linear pattern elements. Whereas the linear element 105 logically could be formed on a single stencil reticle, long pattern elements 105 are especially vulnerable to splitting or other instability of the reticle. To prevent such problems, long linear elements 105 typically are divided (along lines 106, 107) into complementary portions 108, 109, 110.

Real-life technical requirements for microlithography in wafer-fabrication plants include the following:

(1)-higher pattern-transfer accuracy to achieve the target level of device-pattern miniaturization;

(2) higher throughput to handle mass-production of devices; and (3) increased chip size accompanying progress in semiconductor-device complexity.

For example, as chip-size increases, it is not always possible to form all the pattern elements, especially elements subject to complementary patterning as summarized above, on a single reticle. This results in an increase in the number of reticles that must be used. This increases the time required to perform an exposure of an entire pattern, with a corresponding drop in throughput.

SUMMARY OF THE INVENTION

In view of the shortcomings of conventional apparatus and methods as summarized above, an object of the invention is to improve the manner in which a device pattern is divided on the reticle. Another object is to provide charged-particle-beam (CPB) microlithography methods exhibiting improved throughput and pattern-transfer accuracy, especially whenever complementary portions of pattern elements must be exposed.

According to a first aspect of the invention, divided microlithography reticles (e.g., stencil reticles for CPB microlithography) are provided. An embodiment of such a reticle comprises multiple subfields each defining a respective portion of a pattern defined by the reticle. The multiple subfields include pairs of first and second complementary subfields, wherein each pair defines the same respective portion of the pattern, but the constituent first and second complementary subfields of the pair define respective complementary versions of the respective portion. The first complementary subfields are arranged on the reticle in a first stripe, and the second complementary subfields are arranged on the reticle in a second stripe separate from the first stripe.

The reticles are configured especially for use with CPB microlithography. However, they can be used generally for microlithography using any of various types of energy beams, such as visible light, ultraviolet light, X-rays, ion beams, and electron beams.

The first and second stripes can be respective mechanical stripes extending in a reticle-scanning-movement direction. The first and second mechanical stripes can be situated adjacent each other on the reticle. Alternatively, the first and second mechanical stripes can be arranged on the reticle with an intervening mechanical stripe situated between the first and second mechanical stripes.

The first and second stripes can be respective electrical stripes situated in a mechanical stripe, wherein the electrical stripes extend in an illumination-beam-deflection direction perpendicular to the reticle-scanning-movement direction. The first and second electrical stripes can be situated adjacent each other in the mechanical stripe. Alternatively, the first and second electrical stripes can be arranged in the mechanical stripe with an intervening electrical stripe situated between the first and second electrical stripes.

By arranging complementary pattern portions defined by respective electrical stripes in respectively adjoining electrical stripes, warping of the reticle otherwise experienced during loading of the reticle onto the reticle stage can be reduced. Also reduced are errors in the positions of pattern elements on the reticle during and after reticle manufacture, and superposition errors of complementary pattern portions.

In another configuration, the reticle comprises multiple mechanical stripes each extending in a reticle-scanning-movement direction. Each mechanical stripe comprises multiple electrical stripes each extending in an illumination-beam-deflection direction perpendicular to the reticle-scanning-movement direction. The first and second stripes can be respective mechanical stripes situated adjacent each other on the reticle. Alternatively, the first and second mechanical stripes can be arranged on the reticle with an intervening mechanical stripe situated between the first and second mechanical stripes.

By arranging complementary pattern portions in respectively adjacent mechanical stripes, it is possible to reduce positional error on the reticle between mutually complementary pattern portions. Moreover, in this configuration, the distance of movement of the reticle stage is the length of one stripe during exposure of the complementary pattern portion. As a result, the influence of errors of reticle-stage movement is reduced. On the other hand, by arranging complementary pattern portions in mechanical stripes separated from each other by an intervening stripe, it is possible to make similar the movement direction of the reticle stage during exposure of the two complementary stripes. This also can yield a reduced hysteresis of reticle-stage movement, thereby providing a reduced overlay error and/or superposition error of complementary pattern portions.

In another configuration, the reticle comprises multiple mechanical stripes each extending in a reticle-scanning-movement direction. Each mechanical stripe comprises multiple electrical stripes each extending in an illumination-beam-deflection direction perpendicular to the reticle-scanning-movement direction. The first and second stripes can be respective electrical stripes situated adjacent each other in a mechanical stripe. Alternatively, the first and second electrical stripes can be arranged in the mechanical stripe with an intervening electrical stripe situated between the first and second electrical stripes.

According to another embodiment, a divided microlithography reticle is provided. The reticle comprises multiple subfields. The multiple subfields include pairs of first and second complementary subfields. Each pair defines the same respective portion of the pattern, but the constituent first and second complementary subfields of the pair define respective complementary versions of the respective portion. Multiple mechanical stripes each extend in a reticle-scanning-movement direction. Each mechanical stripe comprises multiple electrical stripes each extending in an illumination-beam-deflection direction, and each electrical stripe comprises multiple respective subfields arranged in a row, wherein the first and second complementary subfields are situated adjacent each other on the reticle. With respect to this reticle, the first and second complementary subfields can be situated in the same electrical stripe.

According to another aspect of the invention, charged-particle-beam (CPB) microlithography methods are provided for transferring a pattern, defined by at least one divided reticle, to a sensitive substrate. In an embodiment of such a method, a divided reticle is provided comprising multiple subfields each defining a respective portion of a pattern defined by the reticle. The multiple subfields include pairs of first and second complementary subfields, wherein each pair defines the same respective portion of the pattern, but the constituent first and second complementary subfields of the pair define respective complementary versions of the respective portion. The first complementary subfields are arranged on the reticle in a first stripe and the second complementary subfields are arranged on the reticle in a second stripe separate from the first stripe. The reticle is illuminated stripe-by-stripe with a charged-particle illumination beam so as to produce a charged-particle patterned beam from particles of the illumination beam passing through the reticle. The patterned beam is imaged on a corresponding region on the sensitive substrate so as to stitch together images of the respective subfields as imaged on the sensitive substrate.

With respect to the reticle used in this method, the first and second stripes can be situated adjacent each other on the reticle, wherein the first and second stripes are illuminated sequentially. Alternatively, the first and second stripes can be situated on the reticle with an intervening stripe situated between the first and second stripes, wherein the first and second stripes are illuminated sequentially. The first and second stripes can be electrical stripes situated adjacent each other in a mechanical stripe, wherein each mechanical stripe extends in a reticle-scanning-movement direction, and each electrical stripe extends in an illumination-beam-deflection direction perpendicular to the reticle-scanning-movement direction. Alternatively, the first and second stripes can be respective electrical stripes arranged in a mechanical stripe with an intervening electrical stripe situated between the first and second electrical stripes.

In another embodiment of a CPB microlithography method, a divided reticle is provided that comprises multiple subfields including pairs of first and second complementary subfields. Each pair defines the same respective portion of the pattern, but the constituent first and second complementary subfields of the pair define respective complementary versions of the respective portion. The multiple subfields are arranged in at least one mechanical stripe extending in a reticle-scanning-movement direction and comprising multiple electrical stripes each extending in an illumination-beam scanning direction. Each electrical stripe comprises multiple respective subfields arranged in a respective row, wherein the first and second complementary subfields are situated adjacent each other on the reticle. The reticle is illuminated as described above, and the first and second complementary subfields are exposed sequentially.

In another embodiment of a CPB microlithography method, multiple divided reticles are provided. Each reticle defines a respective portion of the pattern, and each reticle comprises multiple subfields. A first reticle (of the multiple reticles) is illuminated subfield-by-subfield with an illumination beam so as to produce a patterned beam. The patterned beam is imaged on a corresponding region on the sensitive substrate so as to stitch together images of the respective subfields in each chip as imaged on the sensitive substrate. Thus, all the chips on the sensitive substrate are exposed in a sequential manner with the pattern portion defined by the first reticle. Then, a second reticle is illuminated subfield-by-subfield, and the patterned beam is imaged on a corresponding region on the sensitive substrate so as to stitch together images of the respective subfields in each chip. Thus, all the chips are exposed in a sequential manner with the pattern portion defined by the second reticle. By conducting an exposure in this manner, a pattern is not exposed consecutively in the same region on the substrate. Hence, local regions of the substrate experience reduced heating during exposure, with corresponding reductions in pattern-transfer accuracy resulting from thermal expansion of the substrate. In addition, as the respective chips on the substrate are exposed, the time required for moving the reticle stage from the first reticle to the second reticle is reduced, thereby increasing throughput. Any loading-position error arising during reticle-stage loading of respective reticles can be measured in advance by reticle alignment. Conventionally, calculation of positional-error compensation was performed at each exposure of a single chip. With this embodiment, in contrast, a calculation performed once (at time of exposing one substrate) is sufficient, which improves throughput.

In another method embodiment involving multiple reticles, a first reticle is illuminated subfield-by-subfield with an illumination beam so as to produce a patterned beam. The patterned beam is imaged on a corresponding region on the sensitive substrate so as to stitch together images of the respective subfields in a chip. A second reticle is illuminated subfield-by-subfield with the illumination beam, and the patterned beam is imaged on a corresponding region on the sensitive substrate so as to stitch together images of the respective subfields in the chip. These steps are repeated for each of the remaining chips on the sensitive substrate.

Hence, during exposure of a chip with the patterns defined by the multiple reticles, the substrate stage is not moved. Hence, even if a chip experiences a slight thermal deformation during exposure, the center of the chip remains unchanged. This, in turn, reduces positional errors of pattern elements within the chip.

In another method embodiment, a divided reticle is provided that comprises multiple subfields that are arranged into multiple stripes including at least two stripes defining respective pattern portions X, X' that are complementary to each other. While moving the reticle in a scanning direction, the reticle is illuminated stripe-by-stripe with an illumination beam. During such illumination of the two complementary stripes, the reticle moves in the same scanning direction. The resulting patterned beam is imaged on a corresponding region on the sensitive substrate so as to stitch together images of the respective subfields as imaged.

In yet another method embodiment, a divided reticle is provided that comprises multiple subfields. At least some of the subfields are grouped into a first group defining a respective pattern portion X and a second group (complementary to the first group) defining a respective pattern portion X' complementary to the pattern portion X. The first and second groups are arranged in separate reticle regions. While moving the reticle in a scanning direction, the reticle is illuminated with an illumination beam. The reticle moves in the same scanning direction as the first and second complementary groups of subfields are exposed in a sequential manner. The resulting patterned beam is imaged on a corresponding region on the sensitive substrate so as to stitch together images of the respective subfields as imaged. In this embodiment, the first and second complementary groups of subfields can be exposed sequentially but on separate respective chips on the sensitive substrate.

In yet another method embodiment, multiple divided reticles are provided each defining a respective portion of a pattern. Each reticle comprises multiple respective subfields each defining a respective sub-portion of the pattern portion defined by the respective reticle. The multiple reticles are mounted on a reticle stage of a microlithography apparatus. In a reticle-by-reticle sequential manner, each reticle is illuminated with an illumination beam. The resulting patterned beam is imaged on corresponding regions on the sensitive substrate so as to stitch together images of the respective subfields as imaged. The respective pattern portions of the reticles are exposed sequentially on separate chips on the sensitive substrate.

According to another aspect of the invention, CPB microlithography apparatus are provided. An embodiment of such an apparatus comprises a reticle stage, an illumination-optical system, a projection-optical system, a substrate stage, and a controller. The reticle stage is configured to hold a reticle. The reticle defines a pattern and is divided into multiple subfields each defining a respective portion of the pattern. At least some of the subfields are grouped on the reticle so as to form first and second stripes that are mutually complementary to each other. The illumination-optical system is situated upstream of the reticle stage and is configured to direct an illumination beam at a location on the reticle and produce a corresponding patterned beam. The projection-optical system is situated downstream of the reticle stage and is configured to direct the patterned beam from the reticle onto a region of the sensitive substrate corresponding to the illuminated region of the reticle. The substrate stage is situated downstream of the projection-optical system and is configured to provide a surface on which the sensitive substrate is mounted for exposure. The controller is connected to and configured to control operation of the reticle stage, the substrate stage, the illumination-optical system, and the projection-optical system during exposure of the pattern from the reticle to the sensitive substrate. The controller is further configured to expose the first and second stripes in a sequential manner onto the sensitive substrate.

In the apparatus summarized above, the first and second mutually complementary stripes can be situated adjacent each other on the reticle, wherein the controller is configured to expose the first and second mutually complementary stripes in a sequential manner. Alternatively, the first and second mutually complementary stripes are arranged on the reticle with an intervening stripe situated between the first and second complementary stripes, wherein the controller is configured to expose the first and second mutually complementary stripes in a sequential manner.

The first and second mutually complementary stripes can be electrical stripes that are arranged adjacent each other in a mechanical stripe, wherein the controller is configured to expose the first and second mutually complementary electrical stripes in a sequential manner. Alternatively, the first and second mutually complementary stripes can be electrical stripes that are arranged in a mechanical stripe on the reticle with an intervening stripe situated between the first and second complementary stripes in the mechanical stripe, wherein the controller is configured to expose the first and second mutually complementary electrical stripes in a sequential manner.

The reticle stage can be configured to move, during illumination of a stripe, in a respective scanning direction, in which instance the controller is configured to move the reticle stage, during the sequential exposure of the first and second mutually complementary stripes, in the same scanning direction.

In another embodiment, a CPB microlithography apparatus a reticle stage, illumination-optical system, projection-optical system, and a substrate stage essentially as described above. At least some of the subfields of the reticle held by the reticle stage comprise pairs of respective first and second subfields that are mutually complementary to each other. The controller is configured to expose, for each pair of mutually complementary subfields, the respective first and second subfields in a sequential manner onto the sensitive substrate. With respect to a given pair of mutually complementary subfields, the respective first and second subfields can be situated in adjacent regions on the reticle, wherein the controller is configured to expose the first and second mutually complementary electrical stripes in a sequential manner.

Another CPB microlithography apparatus embodiment comprises multiple reticle stages each configured to hold a respective reticle defining a respective portion of a pattern to be transferred to a sensitive substrate. Each reticle is subdivided into multiple respective subfields of the respective pattern portion. The illumination-optical system directs an illumination beam at a location on a selected reticle held by the respective reticle stage. The controller controls operation of the reticle stages, the substrate stage, the illumination-optical system, and the projection-optical system during exposure of the pattern from the reticles to the sensitive substrate. The controller is further configured to expose the respective pattern portion, defined by the selected reticle, onto all chips on the sensitive substrate and then to select a subsequent reticle for exposure onto all chips on the sensitive substrate.

Another CPB microlithography apparatus embodiment includes multiple reticle stages each configured to hold a respective reticle defining a respective portion of a pattern to be transferred to a sensitive substrate. Each reticle is subdivided into multiple respective subfields of the respective pattern portion. The embodiment also comprises an illumination-optical system, a projection-optical system, and a substrate stage as summarized above. The embodiment also includes a controller that controls the reticle stage, substrate stage, illumination-optical system, and projection-optical system during exposure of the pattern from the reticles to the sensitive substrate. The controller is further configured to expose all the respective pattern portions, defined by the multiple reticles, in a sequential manner onto one chip on the sensitive substrate and then progress to a subsequent chip that is exposed in a similar manner.

Yet another embodiment of a CPB microlithography apparatus comprises a reticle stage configured to hold a first and a second reticle each defining a respective complementary portion (X, X', respectively) of a pattern to be transferred to a sensitive substrate. Each reticle is subdivided into multiple respective subfields of the respective pattern portion. An illumination-optical system directs an illumination beam at a location on a selected reticle held by the respective reticle stage. A projection-optical system directs a patterned beam from the selected reticle onto a region of the sensitive substrate corresponding to the illuminated region of the selected reticle. A controller controls operation of the reticle stage, a substrate stage, the illumination-optical system, and the projection-optical system during exposure of the pattern from the reticles to the sensitive substrate. The controller is further configured to expose the respective complementary pattern portions X, X' in a sequential manner while scanning the reticle stage in a same direction for each complementary pattern portion. The controller can be configured to expose the respective complementary pattern portions X, X' sequentially onto separate chips on the sensitive substrate.

Yet another CPB microlithography apparatus embodiment includes multiple reticle stages each configured to hold a respective reticle defining a pattern to be transferred to a sensitive substrate. Each reticle is subdivided into multiple respective subfields. An illumination-optical system directs an illumination beam at a location on a selected reticle held by the respective reticle stage. A projection-optical system directs the resulting patterned beam from the selected reticle onto a region of the sensitive substrate corresponding to the illuminated region of the selected reticle. A controller controls operation of the reticle stages, a substrate stage, the illumination-optical system, and the projection-optical system during exposure of the pattern from the reticles to the sensitive substrate. The controller also is configured to expose the pattern defined by the reticles in a sequential manner on separate chips on the sensitive substrate.

The foregoing and additional features and advantages of the invention will be more readily apparent from the following detailed description, which proceeds with reference to the accompanying drawings.

BRIEF DESCRIPTION OF THE DRAWINGS

FIG. 5 is a schematic plan view of an exemplary divided reticle divided into two major regions.

FIG. 6 is a schematic plan view depicting an arrangement for and exposure of complementary portions of a pattern as arranged on two reticles or reticle portions, as described in the first representative embodiment.

FIG. 7 is a schematic plan view of the pattern of FIG. 6 as projected onto a substrate, as described in the first representative embodiment.

FIG. 20 is a flow chart of steps in a process for manufacturing a microelectronic device such as an integrated circuit, display device, image-sensing device, thin-film magnetic head, micro-machine, or the like.

FIGS. 21(A)–21(B) depict conventional schemes for dividing a pattern element into complementary portions, wherein FIG. 21(A) depicts a donut-shaped element and FIG. 21(B) depicts a long, linear pattern element.

DETAILED DESCRIPTION

This invention is described below in the context of multiple representative embodiments that are not intended to be limiting in any way.

The invention is described below in the context of using an electron beam as an exemplary charged particle beam. It will be understood that the general principles involved with using an electron beam can be applied with equal facility to using an alternative charged particle beam, such as an ion beam.

General Considerations

Figure 1:
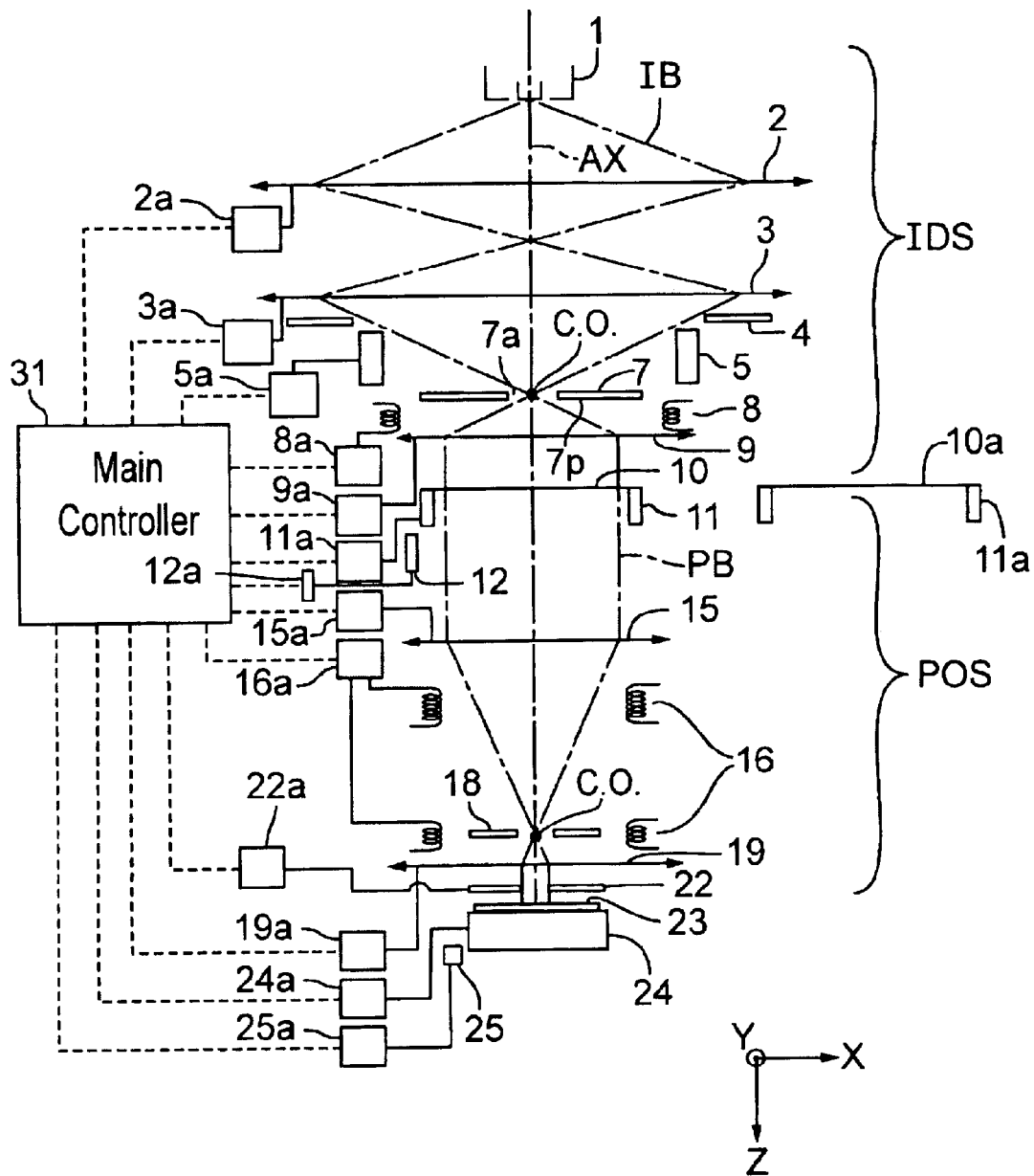
FIG. 1 is an elevational schematic diagram showing certain imaging and control relationships of a charged-particle-beam (CPB) microlithography apparatus that employs a divided reticle according to the invention.

FIG. 1 shows certain imaging and control relationships of a charged-particle-beam (CPB) microlithography apparatus according to a representative embodiment. The apparatus comprises an illumination-optical system IOS and a projection-optical system POS arranged along an optical axis AX. The illumination-optical system IOS comprises optical components situated between an electron gun 1 and a reticle 10, and the projection-optical system POS comprises optical components situated between the reticle 10 and a substrate 23. So as to be imprinted with the pattern as projected from the reticle by the projection-optical system POS, the upstream-facing surface of the substrate 23 is coated with a suitable "resist," thereby rendering the substrate "sensitive" to exposure by the electron beam. The substrate 23 can be any suitable material and configuration, such as a silicon wafer.

At the extreme upstream end of the apparatus, the electron gun 1 emits an electron beam ("illumination beam") IB in a downstream direction along an optical axis AX through the illumination-optical system IOS. The illumination-optical system IOS comprises first and second condenser lenses 2, 3, respectively, a beam-shaping aperture 4, a blanking aperture 7, an illumination-beam deflector 8, and an illumination lens 9. The illumination beam IB from the electron gun 1 passes through the condenser lenses 2, 3, which converge the beam at a crossover C.O. situated at the blanking aperture 7.

The beam-shaping aperture 4 is situated downstream of the second condenser lens 3. The beam-shaping aperture 4 has a profile (e.g., rectangular) that peripherally trims the illumination beam IB as the beam passes through the beam-shaping aperture. Thus, the illumination beam IB is trimmed to have a transverse profile that is shaped and dimensioned to illuminate a single exposure unit (e.g., a single subfield) on the reticle 10. For example, the beam-shaping aperture 4 trims the illumination beam IB to have a square transverse profile with side dimensions of slightly greater than 1 mm as incident on the reticle 10. A focused image of the beam-shaping aperture 4 is formed on the reticle 10 by the illumination lens 9.

As noted above, the blanking aperture 7 is situated, downstream of the beam-shaping aperture 4, at the crossover C.O. The blanking aperture 7 includes an aperture plate 7p that defines an axial through-aperture 7a. During times when the illumination beam IB is "blanked" (prevented from propagating to the reticle 10), the blanking deflector 5 deflects the illumination beam IB off-axis as required to cause the beam to be incident on the aperture plate 7p rather than on the through-aperture 7a. Incidence of the illumination beam IB on the aperture plate 7p blocks the beam from propagating to the reticle 10.

The illumination-beam deflector 8 is situated downstream of the blanking aperture 7, and is configured mainly for scanning the illumination beam IB in the X-direction in FIG. 1 to as to illuminate successive subfields on the reticle 10 in a sequential manner. The respective subfields that are illuminated per scan ("sweep") of the beam are in a respective row on the reticle 10 located within the optical field of the illumination-optical system IOS. The illumination lens 9 is situated downstream of the illumination-beam deflector 8. The illumination lens 9 is a condenser lens that collimates the illumination beam IB for impingement on the reticle 10. Also, as noted above, the illumination lens 9 forms a focused image of the beam-shaping aperture 4 on the upstream-facing surface of the reticle 10.

In FIG. 1 only one subfield of the reticle 10 is shown, situated on the optical axis AX. In actuality, the reticle 10 comprises a large number of subfields, arrayed in the reticle plane extending in the X- and Y-directions (i.e., the X-Y plane). Typically, the reticle 10 defines the pattern for a layer of a microelectronic device, for example an integrated circuit. (The pattern for one layer need not be defined by only one reticle.) The pattern normally extends sufficiently to occupy a "die" on the substrate 23. To ensure that the illumination beam IB illuminates a particular subfield on the reticle 10, the illumination-beam deflector 8 is energized appropriately.

The reticle 10 is mounted on a reticle stage 11 that can be moved in the X- and Y-directions. Similarly, the substrate 23 is mounted on a substrate stage 24 that also is movable in the X- and Y-directions. During imaging of the pattern, the subfields residing in a particular row within the optical field of the illumination-optical and projection-optical systems are illuminated sequentially by scanning ("sweeping") the illumination beam IB in the X-direction (synchronously with scanning of the "imaging beam," propagating downstream of the reticle 10, in the X-direction). The respective width of each row in the X-direction on the reticle 10 and substrate 23 is essentially the width of the optical field of the illumination-optical system IOS and projection-optical system POS, respectively. To progress from one row to the next (and hence expose subfields outside the optical field), the reticle stage 11 and substrate stage 24 undergo respective continuous scanning motions in the Y-direction. Both stages 11, 24 are provided with respective position-measurement systems 12, 25 (typically laser interferometers) that accurately measure the position of the respective stage in the X-Y plane in real time. These accurate positional measurements are critical for achieving proper alignment and "stitching" together of subfield images as projected onto the substrate 23.

FIG. 1 also depicts a second reticle stage 11a to which is mounted a second reticle 10a, so as to illustrate that a CPB microlithography apparatus according to the invention can comprise multiple reticle stages for holding multiple respective reticles. By way of example, as the reticle stage 10 is moved away (typically in a lateral direction), the second reticle stage 11a can be moved laterally into the position previously occupied by the reticle stage 11 so as to place the second reticle into position for transfer of the pattern defined thereby onto the substrate 23.

The projection-optical system POS comprises first and second projection lenses 15, 19, respectively, and a deflector 16 all situated downstream of the reticle 10 along the optical axis AX. As the illumination beam IB is irradiated on a selected subfield of the reticle 10, portions of the beam are transmitted through the reticle while becoming imaged with the respective portion of the reticle pattern defined by the particular subfield. Hence, the beam propagating downstream of the reticle 10 is termed the "imaging beam" or "patterned beam" PB. The patterned beam PB passes through the projection-optical system POS to the substrate 23. In this regard, as the patterned beam PB passes through the projection lenses 15, 19, the image carried by the patterned beam is "demagnified," usually by an integer factor. Hence, the projection lenses 15, 19 collectively have a "demagnification ratio" such as ¼ or ⅕. The patterned beam PB is deflected by the deflector 16 and focused at a specified location on the substrate 23. Also, due to the optical behavior of the projection-optical system POS, the respective directions of sweeps of the illumination beam IB and patterned beam PB in the X-direction are mutually opposite, and the respective directions of motion of the stages in the Y-direction also are mutually opposite. Further detail concerning the projection lenses 15, 19 and the deflector 16 are provided later below in connection with FIG. 4.

As noted above, the upstream-facing surface of the substrate 23 is coated with a suitable resist. Whenever a specified dose of the patterned beam impinges on the resist, the area of impingement is imprinted with the image carried by the patterned beam PB.

A crossover C.O. is situated on the axis AX at a point at which the axial distance between the reticle 10 and the substrate 23 is divided according to the demagnification ratio of the projection lenses 15, 19. A contrast aperture 18 is situated at the crossover. The contrast aperture 18 blocks portions of the patterned beam PB that experienced scattering upon passage through the reticle 10. Thus, the scattered electrons do not propagate to the substrate where they otherwise could degrade image contrast.

A backscattered-electron (BSE) detector 22 is situated directly upstream of the substrate 23. The BSE detector 22 is configured to detect and quantify electrons backscattered from certain marks on the substrate 23 and the substrate stage 24. For example, a mark on the substrate 23 is scanned by patterned beam produced by passage of the illumination beam IB through a corresponding mark pattern on the reticle 10. Detecting of backscattered electrons in this manner provides data from which the relative positional relationship of the reticle 10 and substrate 23 can be determined.

The substrate 23 is mounted on the substrate stage 24 via an electrostatic chuck (not shown but well understood in the art). By simultaneously moving the reticle stage 11 and substrate stage 24 in mutually opposite directions in respective continuous-scanning motions, it is possible to expose each portion of the pattern in a sequential manner. Meanwhile, the position-measurement systems 12, 25 monitor the respective stage position in real time.

Each of the lenses 2, 3, 9, 15, 19 and each of the deflectors 5, 8, 16 is connected to a respective driver 2a, 3a, 9a, 15a, 19a, and 5a, 8a, 16a that supplies electrical power to the lens or deflector. Similarly, each of the stages 11, 24, is connected to a respective driver 11a, 24a that supplies electrical power to the respective stage 11, 24. Each of the drivers 2a, 3a, 5a, 8a, 9a, 11a, 15a, 16a, 19a, 25a is connected to a main controller 31 that generates and routes respective control signals for the drivers, thereby achieving controlled actuation of the lenses, deflectors, and stages. The main controller 31 also receives respective positional data from the respective position-measurement systems 12, 25, which are connected to the main controller 31 via respective data-interface units 12a, 25a. The data-interface units 12a, 25a include amplifiers, analog-to-digital (A/D) converters, and other processing circuitry necessary to interface the data from the respective position-measurement systems 12, 25 to the main controller 31. A similar data-interface 22a connects the BSE detector 22 to the main controller 31.

The main controller 31 ascertains and quantifies control errors associated with stage positions, and actuates the deflector 16 as required to compensate for the control error. Thus, a reduced (demagnified) image of an irradiated reticle subfield is transferred accurately to a target position on the substrate 23. The subfield images are formed on the substrate 23 so as to "stitch" them together in a contiguous manner to form a complete die pattern.

Figure 2A:
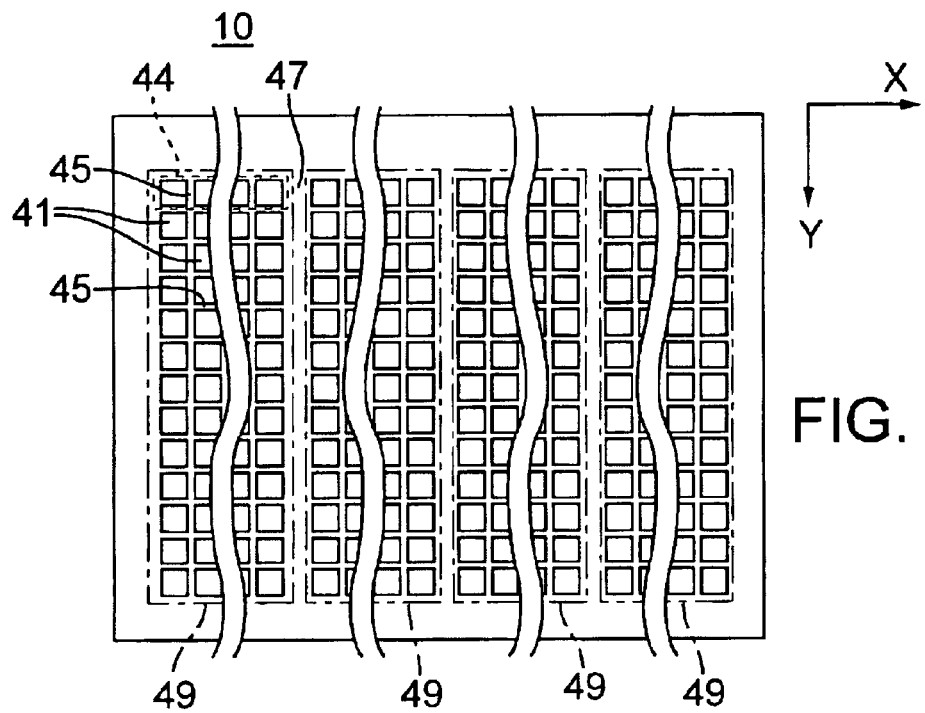
FIG. 2(A) is a plan view of a representative divided reticle.
Figure 2B:
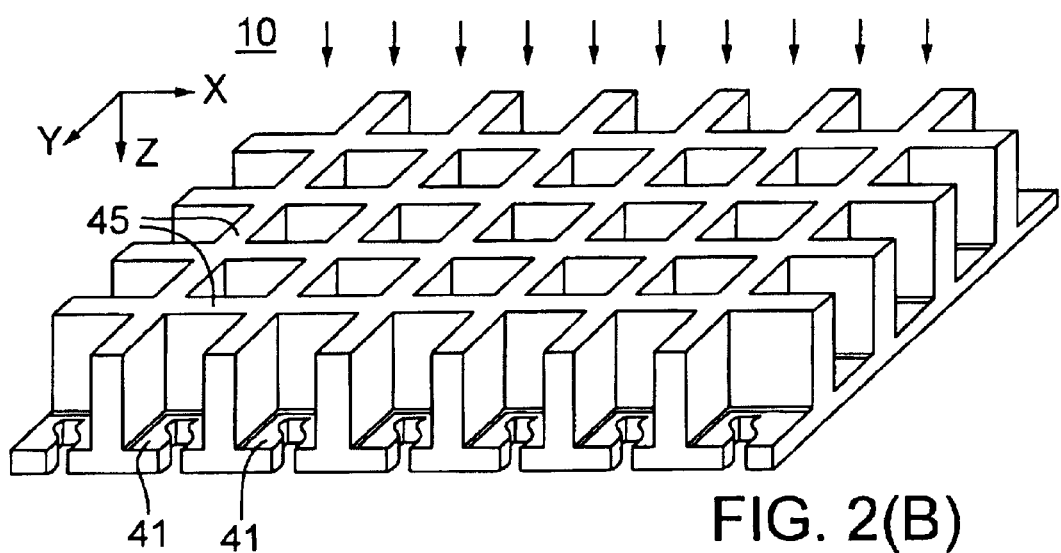
FIG. 2(B) is an oblique view of a portion of the reticle of FIG. 2(A)
Figure 2C:
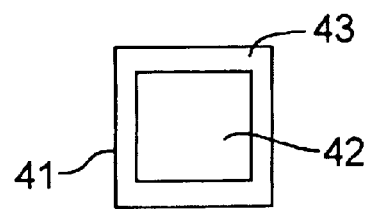
FIG. 2(C) is a plan view of a single subfield of the reticle.

General aspects of a representative divided reticle 10 are shown in FIGS. 2(A)–2(C), wherein FIG. 2(A) is an overall plan view, FIG. 2(B) is an oblique view of a portion of the reticle 10, and FIG. 2(C) is a plan view of a subfield. This type of reticle can be manufactured by electron-beam writing and etching of a silicon wafer, for example.

Turning first to FIG. 2(A), the reticle 10 comprises multiple subregions 41 arrayed in the X- and Y-directions. Each subregion 41 comprises a respective membrane region having a thickness in the range of 0.1 $\mu$m to several $\mu$m, depending upon the type of reticle (the membrane in the stencil reticle is thicker than the membrane in the membrane reticle). As shown in FIG. 2(C), each subregion 41 includes a patterned region 42 surrounded by a "skirt" 43, both constituting the respective membrane region of the subregion 41. The skirt 43 surrounds the patterned region 42. The patterned region 42 constitutes the actual respective "subfield," but the skirt 43 is unpatterned and thus is intended to be the region on which the edges of the illumination beam are incident. The skirts 43 are not shown in FIG. 2(A) or 2(B).

Each subfield 42 typically has a size of approximately 0.5-mm to 5-mm square on the reticle 10. With a projection-optical system POS having a demagnification ratio of, e.g., ⅕, the size of the projected image of the subfield as reduced and projected onto the substrate 23 is approximately 0.1-mm to 1-mm square.

In FIGS. 2(A) and 2(B), the subregions 41 are separated from one another by "grillage" comprising support struts 45. To form the lattice of grillage, the struts 45 intersect each other at right angles as shown and form the periphery of each subregion 41. Each support strut 45 is configured as a structural member that is approximately 0.5 to 1 mm thick (in the Z-direction), for example, to provide mechanical strength and rigidity to the reticle. The width of each support strut 45 (in the X- or Y-direction) is approximately 0.1 mm, for example. The width of each skirt 43 is approximately 0.05 mm, for example.

In the reticle configuration shown in FIG. 2(A), multiple subregions 41 are arrayed in the X-direction in the figure to form rows 44. (The rows 44 also are termed herein "electronic stripes," because the length of each row 44 is approximately equal to the maximum distance of lateral deflection (sweep distance) of the illumination beam IB on the reticle 10, and corresponds to the width of the optical field of the illumination-optical system IOS.) Multiple rows 44 are arrayed in the Y-direction to form a "mechanical stripe" 49 having a width equal to the length of each constituent row (electronic stripe) 44. The mechanical stripes 49 are so named because they each have a length (in the Y-direction) corresponding to a distance over which the reticle stage 11 undergoes mechanical movement during exposure of the respective mechanical stripe 49.

In the configuration of FIG. 2(A), a strut 45 separates each subregion 41 in each row 44. In an alternative configuration in which each row 44 is exposed in a continuous scanning manner, the subregions 41 in each row 44 have no struts 45 therebetween. In this alternative configuration, struts 45 still extend between adjacent rows 44.

The reticle 10 typically comprises multiple mechanical stripes 49 arrayed in the X-direction. Desirably, between each mechanical stripe 49 is a wide strut 47 that provides the reticle with excellent resistance to bending. The wide struts 47 are contiguous with the struts 45, thereby forming an integral grillage for the reticle 10. The wide struts 47 can be deleted if the reticle 10 has sufficient strength and rigidity without them.

Regarding the reticle 10 shown in FIG. 2(A), the subfields in each row (electronic stripe) 44 are exposed sequentially by respective deflections of the illumination and patterned beams. The rows 44 are exposed sequentially in each mechanical stripe 49 by respective continuous motions of the reticle stage 11 and substrate stage 24. Finally, the mechanical stripes 49 are exposed sequentially, by respective stepwise motions of the reticle stage 11 and substrate stage 24, to expose a die on the substrate 23.

Figure 3:
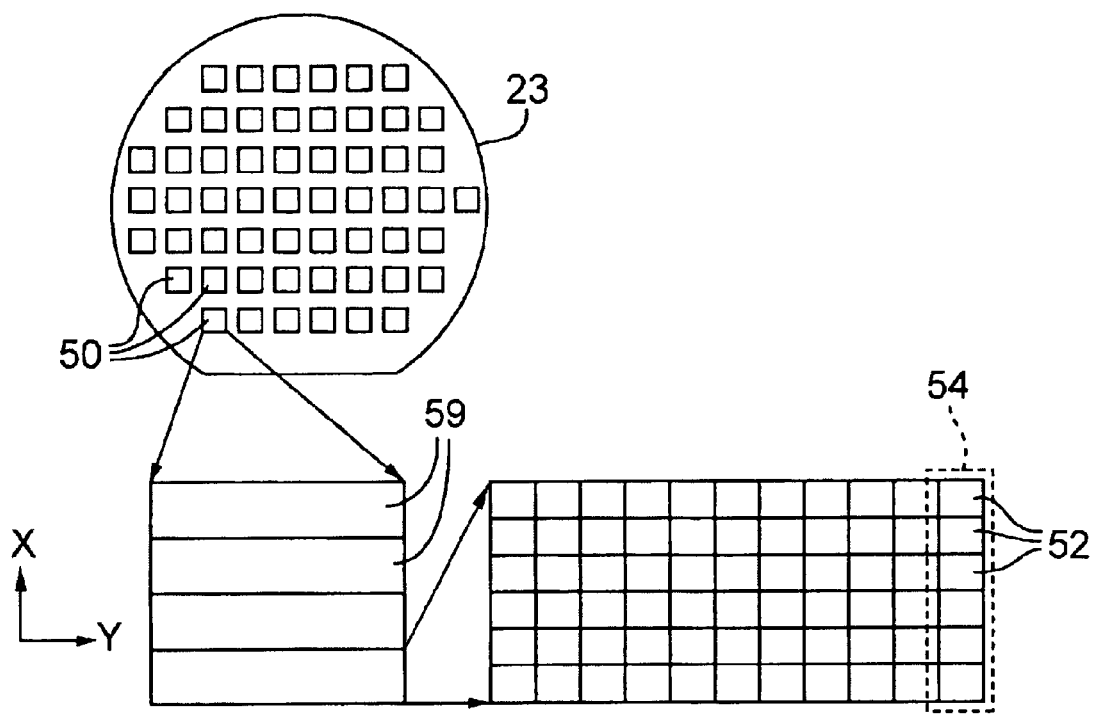
FIG. 3 is a plan view showing exemplary structures of exposed images on a substrate, using a divided reticle.

An exemplary structure of the exposed images on the substrate 23 is shown in FIG. 3, depicting multiple dies ("chips") 50 as formed on the substrate. Each die 50 is divided into four mechanical stripes 59 in the figure. Each mechanical stripe 59 is divided into multiple rows (electronic stripes) 54, and each row 54 includes multiple respective subfield images 52, similar to what is shown in FIG. 2(A). During exposure of each subfield 42 on the reticle 10, non-patterned regions such as the skirt and grillage are not imaged onto the substrate 23. Rather, the subfield images 52 are positioned properly adjacent to and contiguously with each other so as to be stitched together on the substrate.

Figure 4:
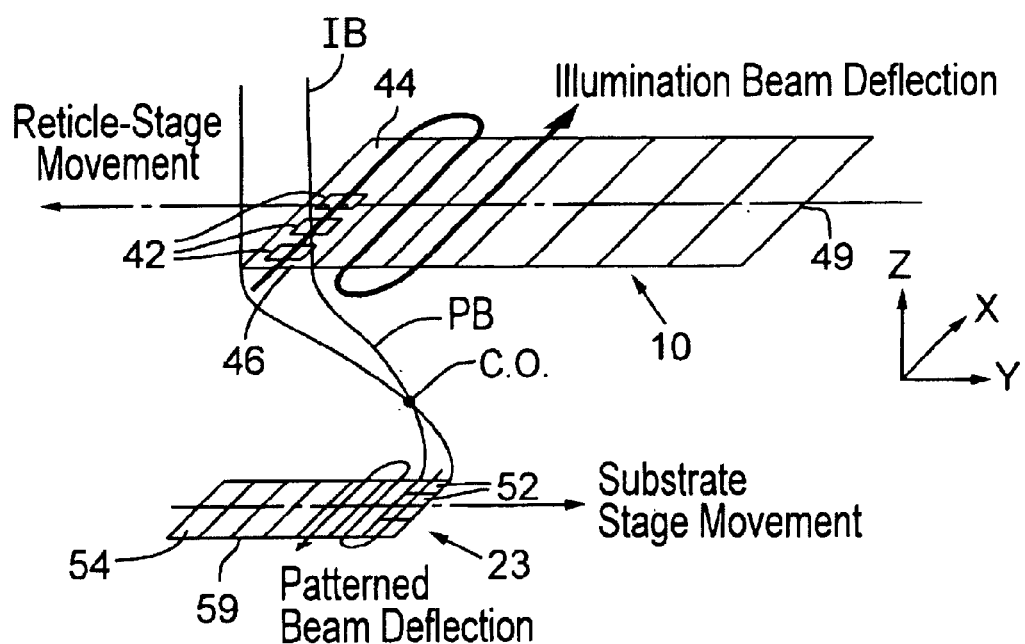
FIG. 4 is an oblique view showing further aspects of exposing a pattern, defined on a divided reticle, to a substrate.

Further aspects of exposing a divided reticle 10 are shown in the oblique view of FIG. 4. In the "upper" portion of the figure is a mechanical stripe 49 on the reticle 10. The mechanical stripe 49 includes multiple rows (electronic stripes) 44 of subfields 42. Skirts and grillage are not shown, but these features are suggested in the figure by the spaces 46 between adjacent subfields 42. A corresponding region on the substrate 23 is shown in the "bottom" portion of the figure. In the figure, the illumination beam IB is illuminating a first subfield 42 in the left-most row 44 of the mechanical stripe 49. The patterned beam PB, produced by passage of a portion of the illumination beam IB through the subfield 42, is projected with demagnification onto the substrate 23 to form a respective subfield image 52 at a prescribed "transfer subfield." This projection is performed by the projection lenses 15, 19 and by the deflectors 16 (see FIG. 1). The subfield images 52 also are arranged in rows (electronic stripes) 54 and mechanical stripes 59, corresponding to respective rows (electronic stripes) 44 and mechanical stripes 49 on the reticle 10.

Between the reticle 10 and the substrate 23, the patterned beam PB is deflected twice by the projection lenses 15, 19 (FIG. 1). The first deflection (performed by the first projection lens 15) is from a propagation direction parallel to the optical axis AX to a convergent direction causing the patterned beam PB to intersect the optical axis AX. The second deflection (performed by the second projection lens 19) is opposite the first deflection.

As noted above, the images of the reticle subfields 42, but not of respective skirts 43 and grillage, are formed at respective "transfer subfields" (imaging positions of respective images of projected subfields) on the substrate 23. The subfield images 52 are projected at the prescribed demagnification ratio of the projection-optical system POS. The respective position of each subfield image 52 (i.e., the accuracy with which the subfield image is stitched to adjacent subfield images on the substrate) is determined by a specific respective actuation of the deflectors 16 as the subfield image 52 is being transferred to the substrate 23. Actuation of the deflectors 16 takes into account not only the demagnification ratio but also the positional shifting required of the subfield images 52 to stitch them together without intervening skirts and struts. Note that at least one deflector 16 is provided for performing respective positional adjustments in each of the X- and Y-directions.

During exposure of a mechanical stripe 49, the reticle stage 11 and substrate stage 24 are moved at constant respective velocities in opposite directions along the Y-axis; more specifically, the motions are along the center line of the respective mechanical stripes 49, 59 (extending in the Y-direction) relative to the optical axis (Z-axis). Thus, an image of the mechanical stripe 49 is formed on the substrate 23. The velocity of the substrate stage 24 relative to the reticle stage 11 takes into account not only the demagnification ratio but also the positional shifting required to eliminate forming images of skirts and struts on the substrate. Typically, each subfield 42 is exposed in a respective individual shot onto the respective transfer subfield on the substrate. Alternatively, each row 44 can be exposed in a scanning manner.

An exemplary divided reticle 10 is shown in FIG. 5. The reticle 10 defines a reticle pattern 10a formed by, for example, electron-beam direct writing and etching on a round silicon wafer 10b having a diameter of 200 mm. In this example, the reticle pattern 10a is divided into two major regions $10a_1$, $10a_2$. In this example, each major region contains 4000 subfields arrayed in 100 rows (electronic stripes) of 40 subfields each, wherein the subfields in each row are arrayed in the X-direction and the rows are arrayed in the Y-direction. A wide strut 10c, approximately 5 mm wide, extends between the two major regions. Each subfield is 1-mm square on the reticle 10. The subfields are separated from one another by struts 45 constituting a grillage (see FIGS. 2(A)–2(B)), wherein each strut is approximately 0.3 mm wide.

Figures 21A, 21B:
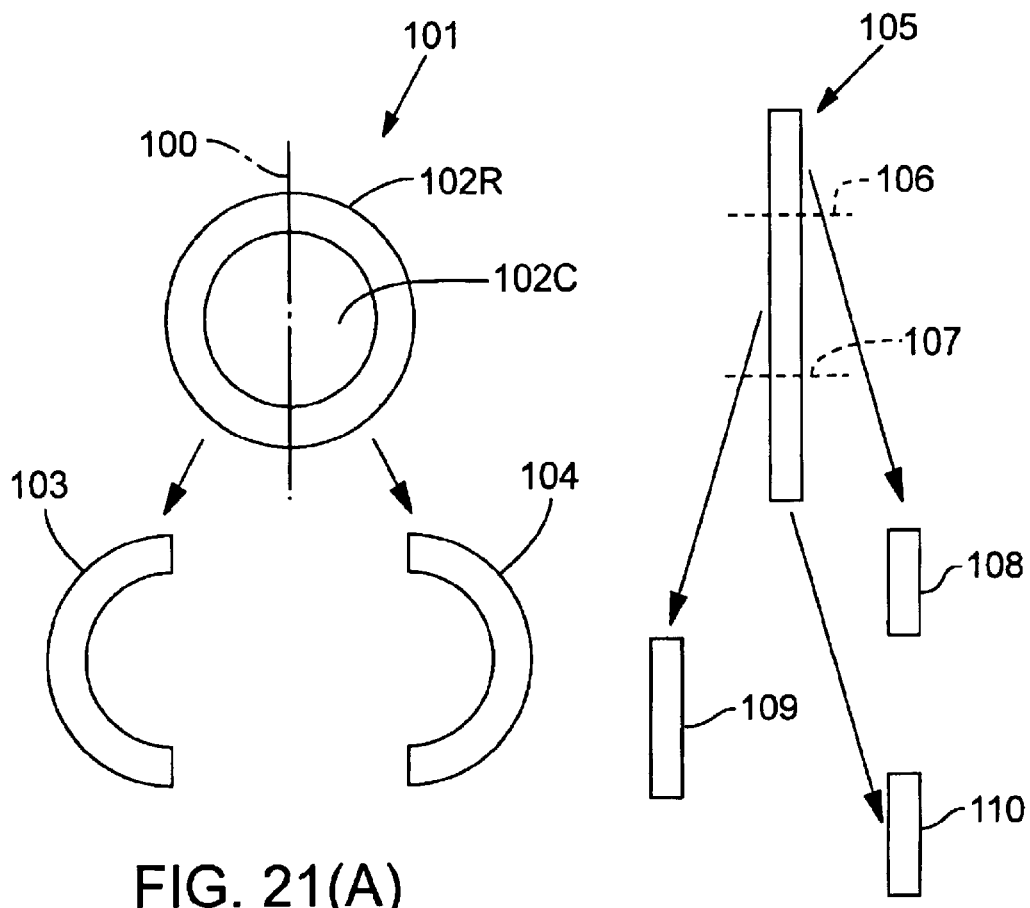

Further with respect to this example, consider a situation in which the illumination beam IB, during illumination of the reticle 10, can be deflected laterally 20 mm. Hence, the reticle of FIG. 5 can be divided into mechanical stripes 49 each 20 mm wide in the X-direction. In such an instance, each row (electrical stripe) 44 is 20 mm long. During exposure of each mechanical stripe 49 of such a reticle 10, the reticle stage 11 holding the reticle is moved continuously in the Y-direction, perpendicular to the deflection direction (X-direction) of the illumination beam IB. If the demagnification ratio is ¼, then the mechanical stripes 20 mm wide on the reticle form corresponding stripes 59 on the substrate that are no more than 5 mm wide. If every subfield of the pattern must be exposed using complementary subfields (e.g., FIGS. 21(A)–21(B)), then the number $N_S$ of mechanical stripes required is determined as follows:

$$2(D_{CW}D_{SW})=N_S$$

wherein $D_{CW}$ is the width of a chip 50 on the substrate 23 and $D_{SW}$ is the width of a mechanical stripe on the substrate 23. In this example, if the prescribed chip size on the substrate 23 is 20 mm in the X-direction and 25 mm in the Y-direction, then $N_S$=2(20 mm/5 mm)=8. Each major portion of the reticle 10 of FIG. 5 has 40 subfields in the X-direction and 100 subfields in the Y-direction. This is sufficient to define four 20-mm wide mechanical stripes 49. But, in this instance, because eight mechanical stripes are required, then two reticles must be used.

In the example above, the complementary portions of the pattern are defined in separate mechanical stripes 49. It will be understood that complementary portions can be in the same electrical stripe or mechanical stripe.

The following representative embodiments are directed to various possible pattern arrangements on a reticle, including complementary portions of the pattern, according to the invention.

First Representative Embodiment

FIG. 6 depicts an arrangement for complementary portions of a pattern, according to this embodiment, as arranged on two reticles 10-1, 10-2. In the configuration shown in FIG. 6, the two reticles 10-1, 10-2 are mounted on a single reticle stage 11 (see FIG. 1). As described above, the pattern defined by the reticle 10-1 is divided into four mechanical stripes 49-1, 49-2, 49-3, 49-4. The mechanical stripes 49-1, 49-2 define the pattern portions A, A', respectively, and the mechanical stripes 49-3, 49-4 define the pattern portions B, B', respectively. The pattern portions A and A' are mutually complementary and are arranged in adjacent mechanical stripes. Similarly, the pattern portions B and B' are mutually complementary and are arranged in adjacent mechanical stripes. The pattern defined by the reticle 10-2 is divided into four mechanical stripes 49-5, 49-6, 49-7, 49-8. The mechanical stripes 49-5, 49-6 define the pattern portions C, C' respectively, and the mechanical stripes 49-7, 49-8 define the pattern portions D, D', respectively. The pattern portions C and C' are mutually complementary and are arranged in adjacent mechanical stripes. Similarly, the pattern portions D and D' are mutually complementary and are arranged in adjacent mechanical stripes.

In FIG. 6, the scanning path 61 assumed by the reticle stage 11 is denoted by the bold serpentine line with arrowheads. This scanning path 61 extends along the center line of each mechanical stripe; at any instant in time, the optical axis (extending in the Z-direction) extends perpendicularly through the scanning path 61. Two-dimensional (X- and Y-direction) motions of the reticle stage 11 are required to produce the scanning path 61. According to the scanning path 61, the mechanical stripes are exposed in sequence. For example, with respect to the reticle 10-1, the mechanical stripe 49-1 is scanned from left to right in the figure, and the mechanical stripe 49-2 immediately below is scanned from right to left. Scanning then proceeds further in this manner to expose, in a sequential manner, the mechanical stripes 49-3 and 49-4 in the reticle 10-1, and the mechanical stripes 49-5, 49-6, 49-7, 49-8 in the reticle 10-2.

FIG. 7 shows the arrangement of pattern portions (as defined on the reticles 10-1, 10-2 in FIG. 6) as projected onto the substrate 23. More specifically, FIG. 7 shows four mechanical stripes 59-1, 59-2, 59-3, 59-4 as projected onto the substrate. Complementary pattern portions A and A' on the reticle 10-1 are transferred onto the same mechanical stripe 59-1. Similarly, complementary pattern portions B and B' on the reticle 10-1 are transferred onto the same mechanical stripe 59-2, complementary pattern portions C and C' are transferred onto the same mechanical stripe 59-3, and complementary pattern portions D and D' are transferred onto the same mechanical stripe 594. By arranging the complementary pattern portions in respective adjoining stripe regions, positional errors on the reticle between the mutually complementary pattern portions are reduced substantially. Moreover, during exposure of complementary pattern portions, the reticle stage 11 moves a distance corresponding to only one stripe portion. This reduces the effects of errors of reticle-stage movements as well as errors in the respective distances of movements of the reticle stage 11 and substrate stage 24.

Second Representative Embodiment

Figure 8:
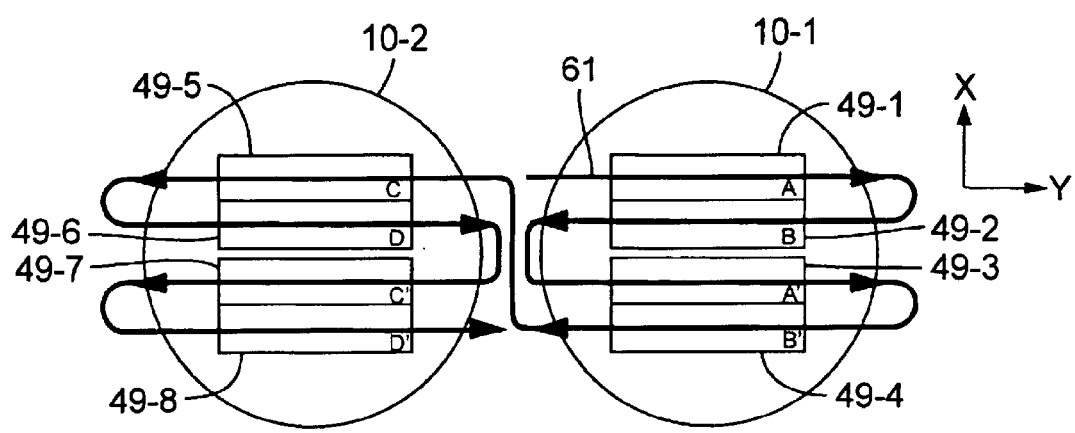
FIG. 8 is a schematic plan view depicting an arrangement for and exposure of complementary portions of a pattern as arranged on two reticles or reticle portions, as described in the second representative embodiment.

FIG. 8 depicts an arrangement for complementary portions of a pattern, according to this embodiment, as arranged on two reticles 10-1, 10-2. In the configuration shown in FIG. 8, the two reticles 10-1, 10-2 are mounted on a single reticle stage 11. The pattern defined by the reticle 10-1 is divided into four mechanical stripes 49-1, 49-2, 49-3, 49-4. The mechanical stripes 49-1, 49-2 define the pattern portions A, B, respectively, and the mechanical stripes 49-3, 49-4 define the pattern portions A', B', respectively. The pattern portions A and A' are mutually complementary and are arranged in respective mechanical stripes 49-1 and 49-3 that flank an intervening stripe 49-2. Similarly, the pattern portions B and B' are mutually complementary and are arranged in respective mechanical stripes 49-2 and 49-4 that flank the intervening stripe 49-3. The pattern defined by the reticle 10-2 is divided into four mechanical stripes 49-5, 49-6, 49-7, 49-8. The mechanical stripes 49-5, 49-6 define the pattern portions C, D, respectively, and the mechanical stripes 49-7, 49-8 define the pattern portions C', D', respectively. The pattern portions C and C' are mutually complementary and are arranged in respective mechanical stripes 49-5 and 49-7 that flank the intervening stripe 49-6. Similarly, the pattern portions D' and D are mutually complementary and are arranged in respective mechanical stripes 49-6 and 49-8 that flank the intervening stripe 49-7.

According to the scanning path 61 shown in FIG. 8, the mechanical stripes are exposed in sequence. Specifically, the mechanical stripe 49-1 of the reticle 10-1 is scanned from left to right in the figure, and the mechanical stripe 49-2 immediately adjacent is scanned from right to left. Scanning then proceeds further in this manner to expose, in a sequential manner, the mechanical stripes 49-3 and 49-4 in the reticle 10-1, and then the mechanical stripes 49-5, 49-6, 49-7, and 49-8 in the reticle 10-2. Thus, the movement directions of the reticle stage 11 during exposure of stripes defining complementary pattern portions are the same. For example, the mechanical stripes 49-1 and 49-3 defining the complementary pattern portions A and A', respectively, are scanned in the same direction, from left to right in the figure.

Figure 9:
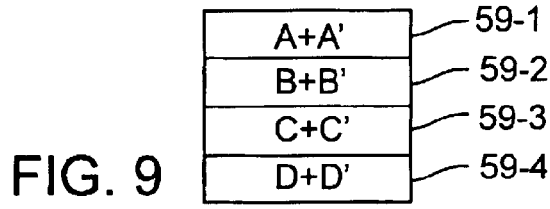
FIG. 9 is a schematic plan view of the pattern of FIG. 8 as projected onto a substrate, as described in the second representative embodiment.

FIG. 9 shows the arrangement of pattern portions (as defined on the reticles 10-1, 10-2 in FIG. 8) as projected onto the substrate 23. More specifically, FIG. 9 shows four mechanical stripes 59-1, 59-2, 59-3, 59-4 as projected onto the substrate. Complementary pattern portions A and A' on the reticle 10-1 are transferred onto the same mechanical stripe 59-1. Similarly, complementary pattern portions B and B' on the reticle 10-1 are transferred onto the same mechanical stripe 59-2, complementary pattern portions C and C' on the reticle 10-2 are transferred onto the same mechanical stripe 59-3, and complementary pattern portions D and D' on the reticle 10-2 are transferred onto the same mechanical stripe 59-4.

By arranging the complementary pattern portions in respective stripes that flank an intervening stripe, the respective movement directions of the reticle stage during exposure of the stripes defining the complementary pattern portions are the same without wasted movements of the reticle stage. This movement scheme reduces hysteresis errors of reticle-stage movements, thereby reducing overlay errors of projected complementary pattern portions.

Third Representative Embodiment

Figure 10:
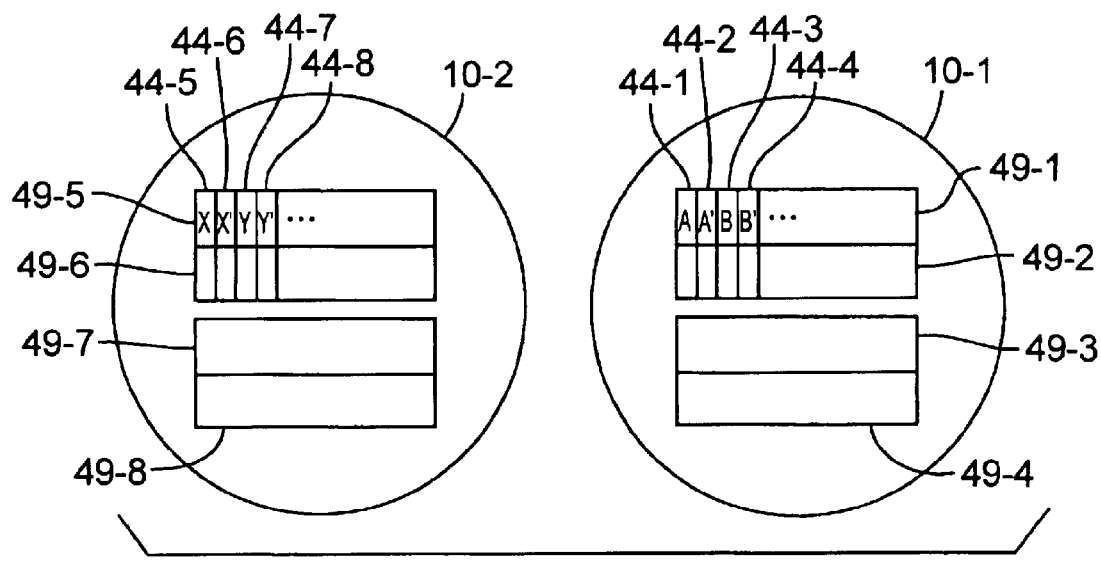
FIG. 10 is a schematic plan view depicting an arrangement for complementary portions of a pattern as arranged on two reticles or reticle portions, 110 as described in the third representative embodiment.

FIG. 10 depicts the arrangement of complementary portions of a pattern, according to this embodiment, as arranged on two reticles 10-1, 10-2. In the configuration shown in FIG. 10, the two reticles 10-1, 10-2 are mounted on a single reticle stage 11. The pattern defined by the reticle 10-1 is divided into four mechanical stripes 49-1, 49-2, 49-3, 49-4, beginning at the top of the right-hand portion of the figure. Each of these mechanical stripes is further divided into multiple electrical stripes. For example, the mechanical stripe 49-1 is divided into electrical stripes 44-1, 44-2, 44-3, 44-4, . . . , defining the pattern portions A, A', B, B', . . . , respectively. The pattern portions A and A' are mutually complementary and are defined in adjacent electrical stripes 44-1, 44-2. Similarly, the pattern portions B and B' are mutually complementary and are defined in adjacent electrical stripes 44-3, 44-4. The pattern defined by the reticle 10-2 is divided into four mechanical stripes 49-5, 49-6, 49-7, 49-8, beginning at the top of the left-hand portion of the figure. Each of these mechanical stripes is further divided into multiple electrical stripes. For example, the mechanical stripe 49-5 is divided into electrical stripes 44-5, 44-6, 44-7, 44-8, . . . , defining the pattern portions X, X', Y, Y', . . . , respectively. The pattern portions X and X' are mutually complementary and are defined in adjacent mechanical stripes 44-5, 44-6. Similarly, the pattern portions Y and Y' are mutually complementary and are defined in adjacent electrical stripes 44-7, 44-8.

In FIG. 10, the scanning path assumed by the reticle stage 11 is not shown. In this example, the reticle stage is moved to scan the mechanical stripe 49-1 from left to right in the figure. Meanwhile, the illumination beam is deflection-scanned in sequence over the electrical stripes 44-1, 44-2, 44-3, 44-4, . . . , of the reticle 10-1. After the mechanical stripe 49-1 is scanned, the reticle stage 11 moves to expose the next mechanical stripe 49-2 from right to left in the figure. Scanning of the remaining mechanical stripes 49-3, 49-4, 49-5, 49-6, 49-7, 49-8 proceeds in a similar manner.

Figure 11:
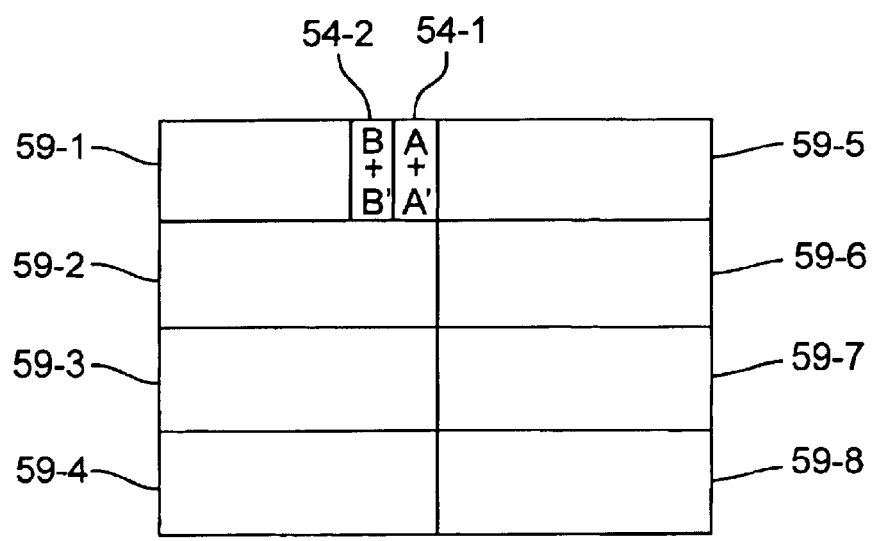
FIG. 11 is a schematic plan view of the pattern of FIG. 10 as projected onto a substrate, as described in the third representative embodiment.

FIG. 11 shows the resulting pattern arrangement on the substrate 23 after exposing the mechanical stripes and electrical stripes as described above. FIG. 11 shows eight exposed mechanical stripes 59-1, 59-2, 59-3, 59-4, 59-5, 59-6, 59-7, 59-8 on the substrate 23. Mechanical stripes 59-1 to 59-4 are arrayed from the top left in the figure, to which mechanical stripes the respective pattern portions defined by the mechanical stripes 49-1 to 494, respectively, on the reticle 10-1 are transferred. Similarly, mechanical stripes 59-5 to 59-8 are arrayed from the top right in the figure, to which mechanical stripes the respective pattern portions defined by the mechanical stripes 49-5 to 49-8, respectively, on the reticle 10-2 are transferred.

Each of the mechanical stripes 59 on the substrate 23 is divided into multiple electrical stripes 54. For example, two electrical stripes 54-1, 54-2 are shown in the mechanical stripe 59-1. Complementary pattern portions A and A' on the reticle 10-1 are transferred into the electrical stripe 54-1, and complementary pattern portions B and B' are transferred into the electrical stripe 54-2.

By arranging the complementary pattern portions, divided into electrical stripes, in respective adjacent stripe regions as in this embodiment, warping of the reticle when loaded onto the reticle stage is reduced. Also reduced are errors in the pattern-element positions on the reticle resulting from reticle manufacture, as well as errors in overlay of complementary pattern portions as projected.

Fourth Representative Embodiment

Figure 12:
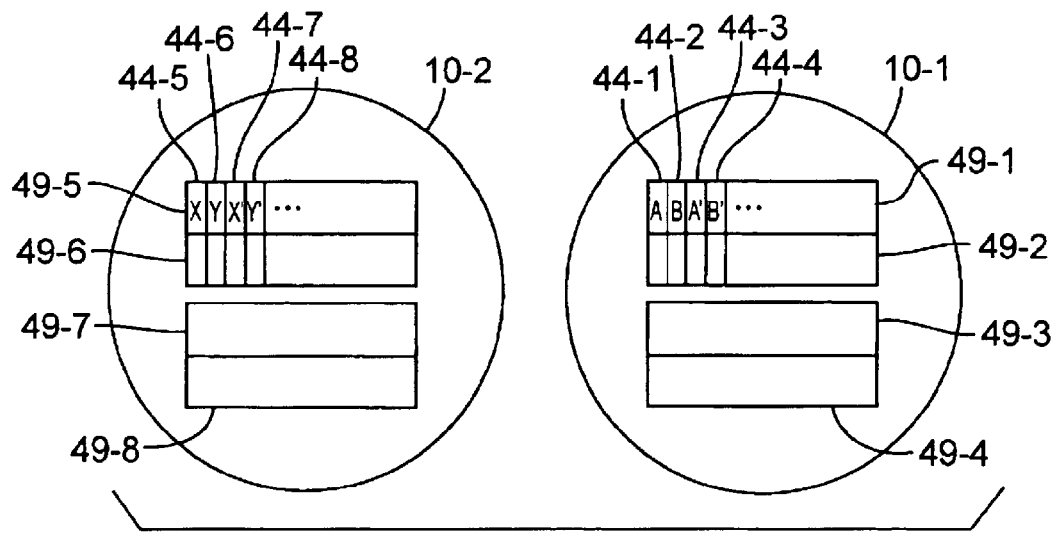
FIG. 12 is a schematic plan view depicting an arrangement for complementary portions of a pattern as arranged on two reticles or reticle portions, as described in the fourth representative embodiment.

FIG. 12 depicts the arrangement of complementary portions of a pattern, according to this embodiment, as arranged on two reticles 10-1, 10-2. In the configuration shown in FIG. 10, the two reticles 10-1, 10-2 are mounted on a single reticle stage 11. The pattern defined by the reticle 10-1 is divided into four mechanical stripes 49-1, 49-2, 49-3, 49-4, beginning at the top right in the figure. Each of these mechanical stripes is further divided into electrical stripes 44-1, 44-2, 44-3, 44-4, . . . , defining the pattern portions A, B, A', B', . . . , respectively. The pattern portions A and A' are mutually complementary and are defined in respective electrical stripes 44-1, 44-3 that flank the intervening electrical stripe 44-2 defining the pattern portion B. The pattern portions B and B' are mutually complementary and are defined in respective electrical stripes 44-2, 44-4 that flank the intervening electrical stripe 44-3 defining the pattern portion A'. The pattern defined by the reticle 10-2 is divided into four mechanical stripes 49-5, 49-6, 49-7, 49-8, beginning at the top left in the figure. Each of these mechanical stripes is further divided into electrical stripes 44-5, 44-6, 44-7, 44-8, . . . , defining the pattern portions X, Y, X', Y', respectively. The pattern portions X and X' are mutually complementary and are defined in respective electrical stripes 44-5, 44-7 that flank the intervening electrical stripe 44-6 defining the pattern portion Y. The pattern portions Y, Y' are mutually complementary and are defined in respective electrical stripes 44-6, 44-8 that flank the intervening electrical stripe 44-7 defining the pattern portion X'.

In FIG. 12, the scanning path assumed by the reticle stage 11 is not shown. In this example, the reticle stage is moved to scan the mechanical stripe 49-1 from left to right in the figure. Meanwhile, the illumination beam IB is deflection-scanned in sequence over the electrical stripes 44-1, 44-2, 44-3, 44-4, . . . , of the reticle 10-1. After the mechanical stripe 49-1 is scanned, then the reticle stage 11 moves to expose the next mechanical stripe 49-2 from right to left in the figure. Scanning of the remaining mechanical stripes 49-3, 49-4, 49-5, 49-6, 49-7, 49-8 proceeds in a similar manner.

By configuring the reticles and scanning them in a manner according to this embodiment, the direction in which the illumination beam IB is deflected during exposure of the electrical stripes defining mutually complementary pattern portions is the same. For example, the electrical stripe 44-1 defining the pattern portion A is deflection-scanned from top to bottom in the figure, and the electrical stripe 44-2 defining the pattern portion B is deflection-scanned from bottom to top in the figure. As a result, the electrical stripe 44-3 defining the adjacent complementary pattern portion A', and the electrical stripe 44-1 defining the adjacent pattern portion A, are deflection-scanned from top to bottom in the figure. By making the deflection direction of the illumination beam during exposure of electrical stripes defining mutually complementary pattern portions the same, hysteresis errors of deflection of the illumination beam are reduced, with an accompanying reduction in pattern overlay error.

Fifth Representative Embodiment

Figure 13:
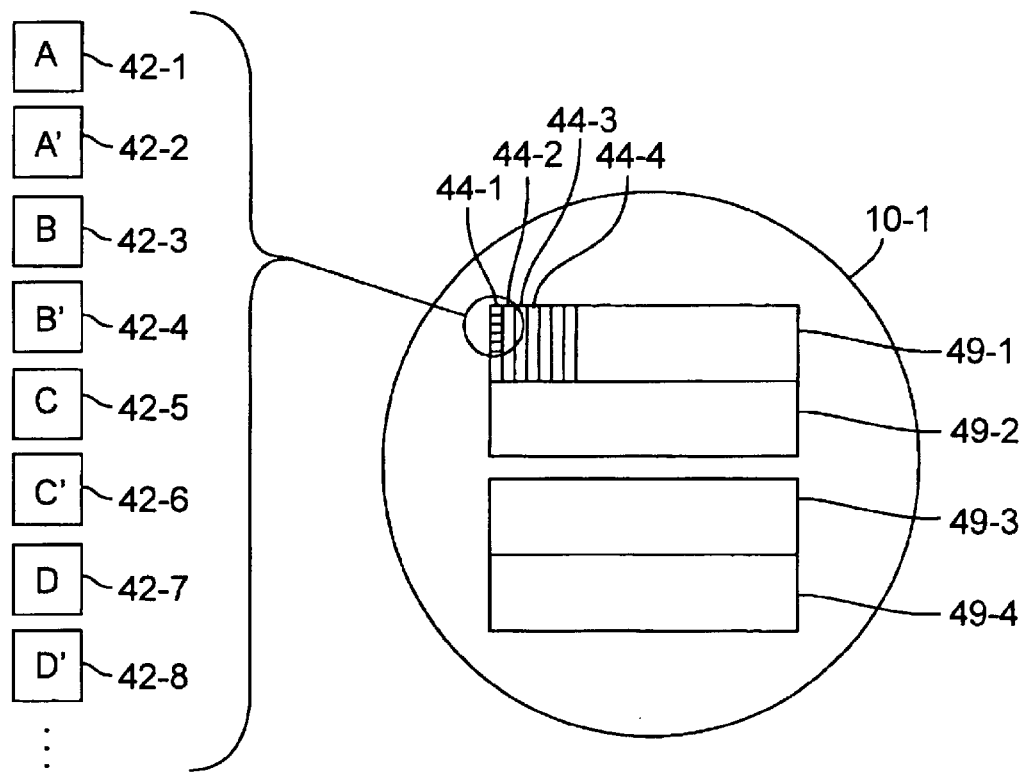
FIG. 13 is a schematic plan view depicting an arrangement for complementary portions of a pattern as arranged on a reticle, as described in the fifth representative embodiment.

FIG. 13 depicts the arrangement of complementary pattern portions on a reticle, according to this embodiment. In this embodiment, multiple reticles are mounted on the reticle stage 11; but, in FIG. 13, only one reticle 10-1 is shown. The pattern defined by the reticle 10-1 is divided into four mechanical stripes 49-1, 49-2, 49-3, 49-4, beginning at the top of the figure. Each of these mechanical stripes is further divided into multiple electrical stripes, and each electrical stripe is subdivided into multiple subfields. For example, the mechanical stripe 49-1 is divided into multiple electrical stripes 44-1, 44-2, 44-3, 44-4, . . . In the enlargement shown on the left side of the figure, the electrical stripe 44-1 is divided into respective subfields 42-1, 42-2, 42-3, 42-4, 42-5, 42-6, 42-7, 42-8, . . . , beginning at the top (in the figure) of the electrical stripe. As can be seen, the complementary pattern portions A and A' are defined in the adjacent subfields 42-1 and 42-2, respectively. Similarly, the complementary pattern portions B and B' are defined in adjacent subfields 42-3 and 44-4, respectively; the complementary pattern portions C and C' are defined in adjacent subfields 42-5 and 42-6, respectively; and the complementary pattern portions D and D' are defined in adjacent subfields 42-7 and 42-8, respectively.

By defining complementary pattern portions in respective adjacent subfields as in this embodiment, reticle warping exhibited when the reticle is mounted onto the reticle stage is reduced. Also reduced are errors in the respective positions of pattern elements on the reticle after reticle manufacture, as well as overlay errors of complementary patterns.

Sixth Representative Embodiment

Figure 14:
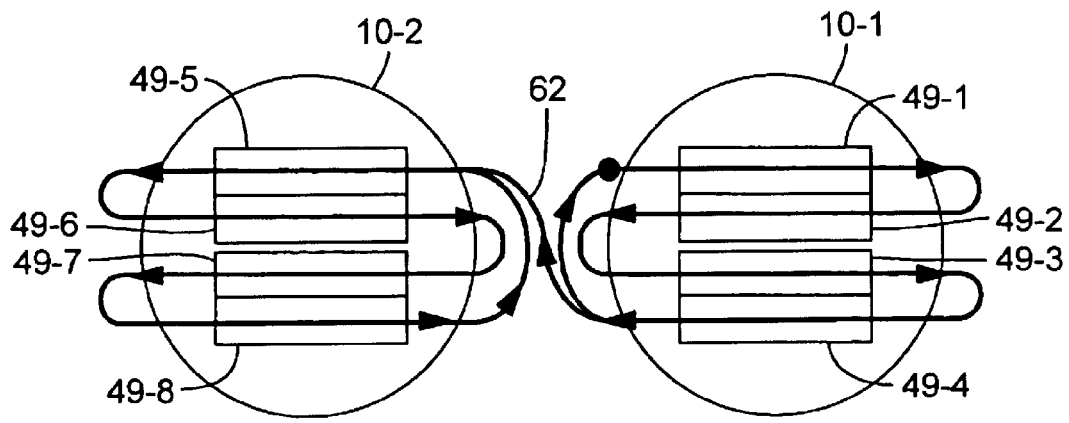
FIG. 14 is a schematic plan view depicting an arrangement for and exposure of complementary portions of a pattern as arranged on two reticles or reticle portions, as described in the sixth representative embodiment.

FIG. 14 depicts a method for exposing complementary pattern portions according to this embodiment. FIG. 14 shows two reticles 10-1, 10-2 mounted on a reticle stage 11. The reticle 10-1 is divided into four mechanical stripes 49-1, 49-2, 49-3, 49-4, beginning at the top right in the figure. Similarly, the reticle 10-2 is divided into four mechanical stripes 49-5, 49-6, 49-7, 49-8, beginning at the top left in the figure.

The scanning path 62 assumed by the reticle stage 11 is denoted by the bold serpentine line with arrowheads. In this embodiment, the mechanical stripe 49-1 of the reticle 10-1 is scanned from left to right in the figure, and the adjacent (next lower in the figure) mechanical stripe 49-2 is scanned from right to left. Scanning then proceeds in a similar manner to the mechanical stripes 49-3 and 49-4 to expose the respective pattern portions on a respective die 50 on the substrate 23. To expose these pattern portions on each of the remaining dies 50 on the substrate 23, scanning exposure (in the manner just described) of the mechanical stripes 49-1, 49-2, 49-3, 49-4 of the reticle 10-1 is repeated as required.

After completing exposure of the pattern portion defined on the reticle 10-1 onto each of the dies 50 on the substrate 23, exposure of the second reticle 10-2 commences, beginning with the first die, according to the scanning path 62. Specifically, the mechanical stripe 49-5 of the reticle 10-2 is scanned from right to left in the figure. The adjacent (next lower in the figure) mechanical stripe 49-6 is scanned from left to right. Scanning then proceeds in a similar manner to the mechanical stripes 49-7 and 49-8 to expose the respective pattern portions on a respective die 50 on the substrate 23. To expose these pattern portions on each of the remaining dies 50 on the substrate 23, scanning exposure (in the manner just described) of the mechanical stripes 49-5, 49-6, 49-7, 49-8 of the reticle 10-2 is repeated as required.

By performing exposure according to this embodiment, a respective pattern portion is never exposed consecutively in the same area on the substrate 23. As a result, only a small amount of localized heating (due to exposure) is applied to any portion of the substrate at any instant. The reduced localized thermal expansion of the substrate yields better pattern-transfer accuracy.

Also, as respective dies on the substrate 23 are exposed, the amount of time required to move the reticle stage 11 from the first reticle 10-1 to the second reticle 10-2 is reduced overall, yielding increased throughput.

This embodiment also permits measurements of loading-position errors (errors of relative positions of the reticles 10-1, 10-2 on the reticle stage 11 at time of mounting the reticles to the reticle stage) to be obtained in advance in reticle alignments. Previously, determining a compensatory adjustment for positional errors is performed at each exposure of a single die on the substrate. According to this embodiment, in contrast, these calculations need be performed only once per substrate, which increases throughput.

Seventh Representative Embodiment

Figure 15:
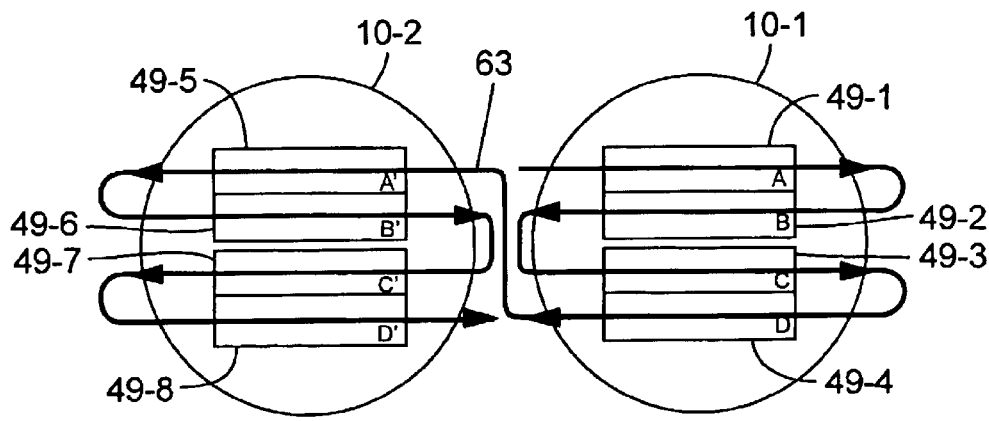
FIG. 15 is a schematic plan view depicting an arrangement for and exposure of complementary portions of a pattern as arranged on two reticles or reticle portions, as described in the seventh representative embodiment.

A method for exposing complementary pattern portions according to this embodiment is depicted in FIG. 15. FIG. 15 shows two reticles 10-1, 10-2 mounted on a reticle stage 11. The reticle 10-1 is divided into four mechanical stripes 49-1, 49-2, 49-3, 49-4, beginning at the top (in the figure) of the reticle. Similarly, the reticle 10-2 is divided into four mechanical stripes 49-5, 49-6, 49-7, 49-8, beginning at the top (in the figure) of the reticle.

The scanning path 63 assumed by the reticle stage 11 is denoted by the bold serpentine line including arrowheads. In this embodiment, the mechanical stripe 491 of the reticle 10-1 is scanned from left to right in the figure, and the adjacent (next lower in the figure) mechanical stripe 49-2 is scanned from right to left. Scanning then proceeds in a similar manner to the mechanical stripes 49-3 and 49-4 to expose the respective pattern portions on a respective die 50 on the substrate 23. After completing exposure of the pattern portion defined on the reticle 10-1 onto a die 50 on the substrate 23, exposure of the second reticle 10-2 commences, according to the scanning path 63. Specifically, the mechanical stripe 49-5 of the reticle 10-2 is scanned from right to left in the figure. The adjacent (next lower in the figure) mechanical stripe 49-6 is scanned from left to right. Scanning then proceeds in a similar manner to the mechanical stripes 49-7 and 49-8 to expose the respective pattern portions on the die 50 on the substrate 23.

After one die 50 has been exposed completely (with both reticles 10-1, 10-2) as described above, exposure of the second die on the substrate is performed in the same manner as the first die, and so on for each of the remaining dies on the substrate.

By exposing each die completely before progressing to the next die on the substrate, the net distance over which the substrate stage 24 must move during exposure of the substrate 23 is reduced, with a corresponding increase in throughput. Consequently, it is advantageously possible to reduce pattern-overlay and stitching errors.

In addition, the substrate stage 24 is not moved during exposure of each die with the pattern portions defined by the multiple reticles 10-1, 10-2. As a result, even if the die experiences a slight thermal deformation during exposure, the center position of the die is unchanged. This reduces position errors of pattern elements within each die as exposed onto the substrate.

Eighth Representative Embodiment

Figure 16:
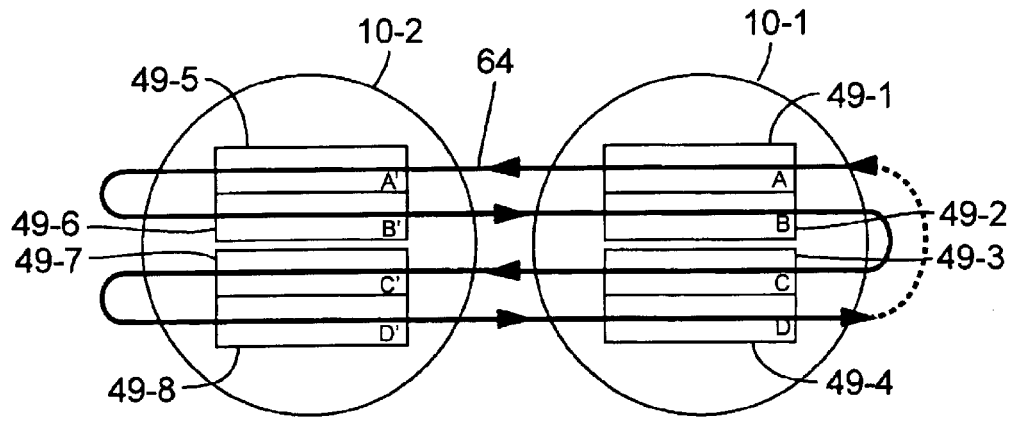
FIG. 16 is a schematic plan view depicting an arrangement for and exposure of complementary portions of a pattern as arranged on two reticles or reticle portions, as described in the eighth representative embodiment.

An arrangement of and method for exposing complementary pattern portions according to this embodiment are shown in FIG. 16. Two reticles 10-1, 10-2 are mounted on a reticle stage 11. As described above, the reticle pattern defined by the first reticle 10-1 is divided into four mechanical stripes 49-1, 49-2, 49-3, 49-4 defining pattern portions A, B, C, D, respectively, and arranged from top to bottom (in the figure) in the depicted sequence. The reticle pattern defined by the second reticle 10-2 is divided into four mechanical stripes 49-5, 49-6, 49-7, 49-8 defining pattern portions A', B', C', D', respectively, and arranged from top to bottom (in the figure) in the depicted sequence. Each pair of pattern portions A and A', B and B', C and C', and D and D' are mutually complementary.

In FIG. 16, the scanning path 64 assumed by the reticle stage 11 is denoted by the bold serpentine line with arrowheads. In this embodiment, the mechanical stripe 49-1 of the reticle 10-1 is scanned from right to left in the figure, followed by right-to-left scanning of the mechanical stripe 49-5 of the reticle 10-2. Then, the mechanical stripe 49-6 (immediately adjacent the mechanical stripe 49-5 on the reticle 10-2) is scanned from left to right in the figure, followed to left-to-right scanning of the mechanical stripe 49-2 of the reticle 10-1. Scanning proceeds in a similar manner for the remaining mechanical stripes 49-3 and 49-7, and 49-8 and 494. In this manner, the respective pattern portions defined on the two reticles 10-1, 10-2 are exposed sequentially on the substrate 23.

Figure 17A:
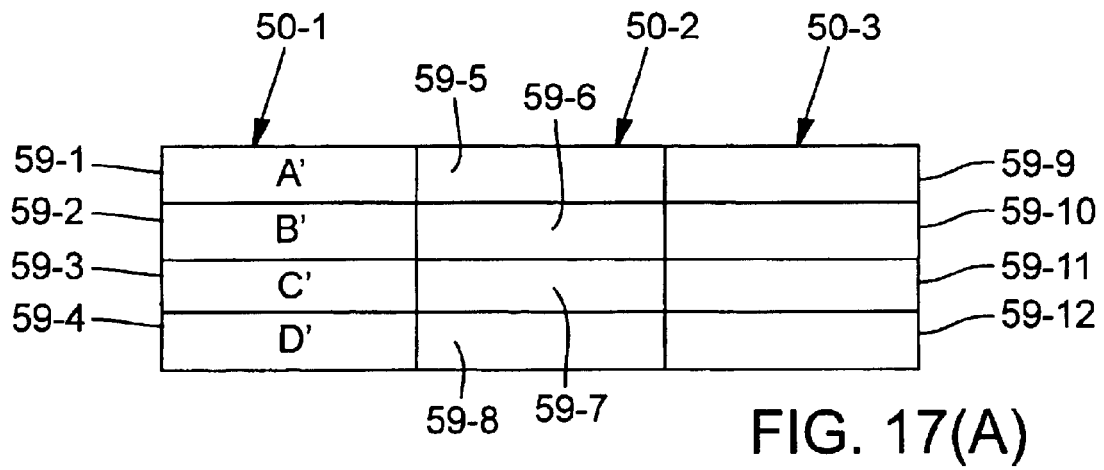
FIGS. 17(A)–17(C) are schematic plan views showing respective stages in the projection of the pattern of FIG. 16 onto a substrate, as described in the eighth representative embodiment.
Figure 17B:
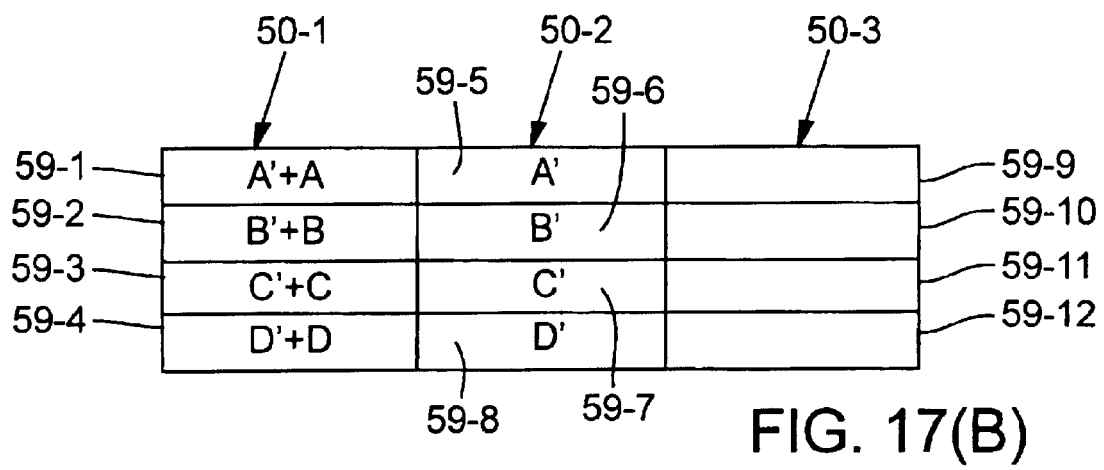
Figure 17C:
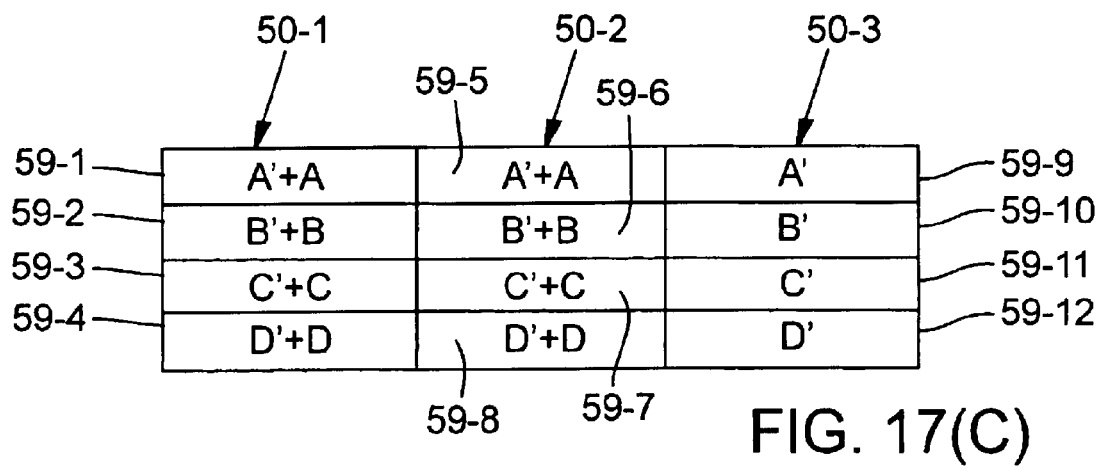

FIGS. 17(A)–17(C) depict the order of exposure of three dies 50-1, 50-2, 50-3 on a substrate 23 exposed according to this embodiment. Specifically, FIG. 17(A) shows the results of a first stage of exposure, FIG. 17(B) shows the results of a second stage of exposure, and FIG. 17(C) shows the results of a third stage of exposure of the three dies.

In FIGS. 17(A)–17(C), the left-hand die 50-1 contains the mechanical stripes 59-1 to 59-4, in order from the top (in the figure) of the die; the middle die 50-2 contains the mechanical stripes 59-5 to 59-8 in order from the top (in the figure) in the die; and the right-hand die 50-3 contains the mechanical stripes 59-9 to 59-12 in order from the top (in the figure) of the die. In the first stage of exposure (FIG. 17(A)), complementary pattern portions A', B', C', D' defined on the reticle 10-2 are transferred to the mechanical stripes 59-1, 59-2, 59-3, 59-4, respectively, of the left-hand die 50-1 on the substrate 23.

In the second stage of exposure (FIG. 17(B)), the pattern portion A defined on the reticle 10-1 is transferred to the mechanical stripe 59-1 of the left-hand die 50-1 according to the scanning path 64 of the reticle stage 11. Next, the pattern portion A' defined on the reticle 10-2 is transferred to the mechanical stripe 59-5 of the middle die 50-2. Subsequent transfers of pattern portions proceed in the order B', B, C, C', D', D according to the scanning path 64. Hence, in this stage of exposure, the complementary pattern portions A and A', B and B', C and C', and D and D' are transferred to respective mechanical stripes 59-1, 59-2, 59-3, 59-4 of the left-hand die 50-1, and the pattern portions A', B', C', and D' defined on the reticle 10-2 are transferred to respective mechanical stripes 59-5, 59-6, 59-7, 59-8 of the middle die 50-2.

In the third stage of exposure (FIG. 17(C)), the pattern portion A defined on the reticle 10-1 is transferred to the mechanical stripe 59-5 of the middle die 50-2 according to the scanning path 64 of the reticle stage 11. Next, the pattern portion A' defined on the reticle 10-2 is transferred to the mechanical stripe 59-9 of the right-hand die 50-3. Subsequent transfers of pattern portions proceed in the order B', B, C, C', D', D according to the scanning path 64. Hence, at this stage of exposure, the complementary pattern portions A and A', B and B', C and C', and D and D' are transferred to respective mechanical stripes 59-5, 59-6, 59-7, 59-8 of the middle die 50-2, and the pattern portions A', B', C', D' defined on the reticle 10-2 are transferred to respective mechanical stripes 59-9, 59-10, 59-11, 59-12 of the right-hand die 50-3 on the reticle 23.

To expose the remainder of the substrate 23, exposure continues in a manner as described above for each group of three dies. By performing substrate exposure in this manner, the number of turnarounds of the reticle stage is reduced, which correspondingly improves throughput.

Ninth Representative Embodiment

Figure 18:
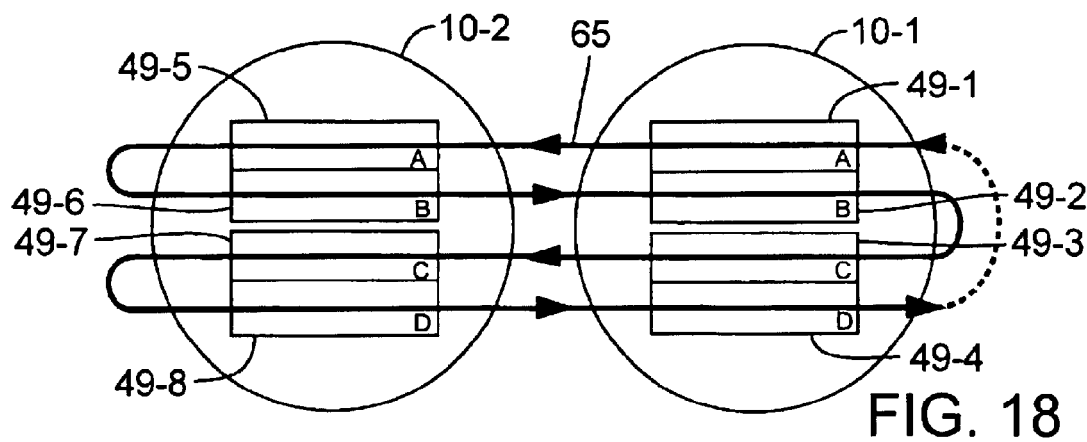
FIG. 18 is a schematic plan view depicting an arrangement for and exposure of complementary portions of a pattern as arranged on two reticles or reticle portions, as described in the ninth representative embodiment.

An arrangement of and method for exposing complementary pattern portions according to this embodiment are shown in FIG. 18. Two reticles 10-1, 10-2 are mounted on a reticle stage 11. As described above, the reticle pattern defined by the first reticle 10-1 is divided into four mechanical stripes 49-1, 49-2, 49-3, 494 defining pattern portions A, B, C, D, respectively, and arranged from top to bottom (in the figure) in the depicted sequence. The reticle pattern defined by the second reticle 10-2 is divided into four mechanical stripes 49-5, 49-6, 49-7, 49-8 defining the pattern portions A, B, C, D, respectively, and arranged from top to bottom (in the figure) in the depicted sequence.

In FIG. 18, the scanning path 65 assumed by the reticle stage 11 is denoted by the bold serpentine line with arrowheads. In this embodiment, the mechanical stripe 49-1 of the reticle 10-1 is scanned from right to left in the figure, followed by right-to-left scanning of the mechanical stripe 49-5 of the reticle 10-2. Then, the mechanical stripe 49-6 (immediately adjacent the mechanical stripe 49-5 on the reticle 10-2) is scanned from left to right in the figure, followed to left-to-right scanning of the mechanical stripe 49-2 of the reticle 10-1. Scanning continues in a similar manner for the remaining mechanical stripes 49-3 and 49-7, and 49-8 and 49-4. In this manner, the respective pattern portions defined on the two reticles 101, 10-2 are exposed on the substrate 23.

Figure 19A:
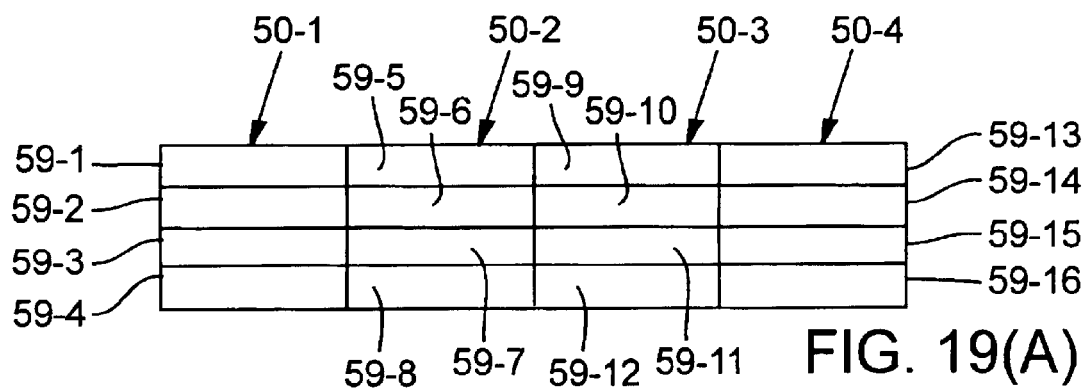
FIGS. 19(A)–19(C) are schematic plan views showing respective stages in the projection of the pattern of FIG. 18 onto a substrate, as described in the ninth representative embodiment.
Figure 19B:
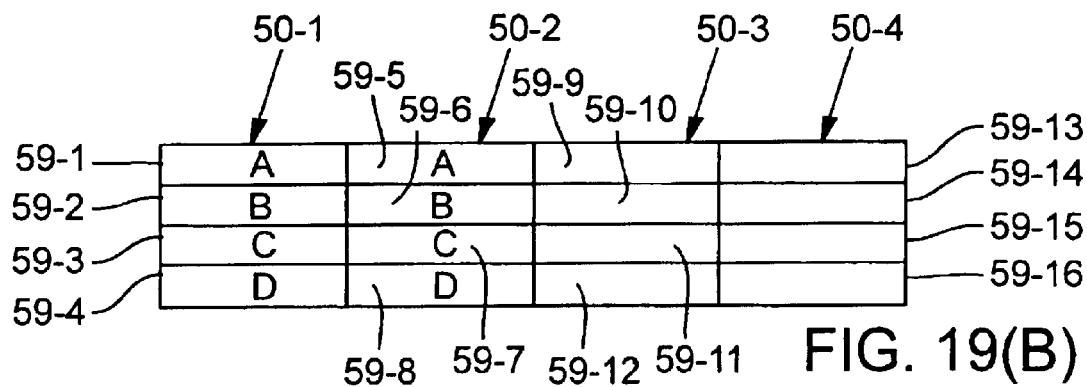
Figure 19C:
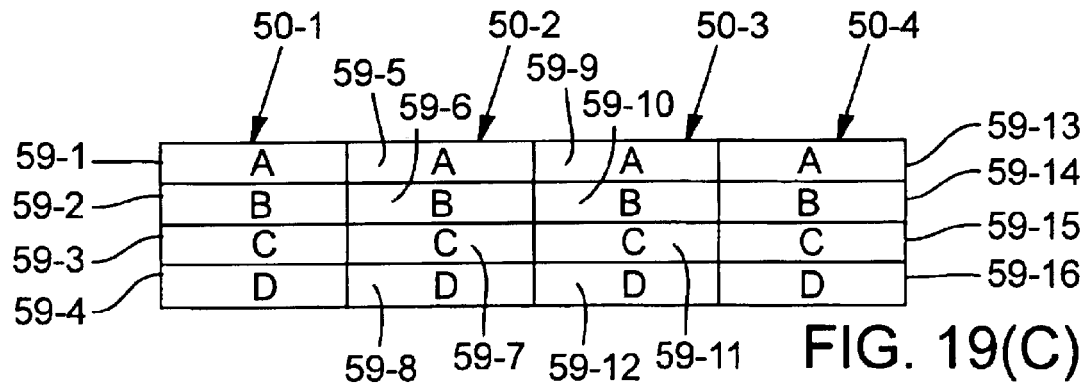

FIGS. 19(A)–19(C) depict the order of exposure of four dies 50-1, 50-2, 50-3, 50-4 on a substrate 23 exposed according to this embodiment. Specifically, FIG. 19(A) shows the results of a first stage of exposure, FIG. 19(B) shows the results of a second stage of exposure, and FIG. 19(C) shows the results of a third stage of exposure of the four dies.

In FIGS. 19(A)–19(C), the left-hand die 50-1 contains the mechanical stripes 59-1, 59-2, 59-3, 59-4, in order from the top (in the figure) of the die; the second die 50-2 contains the mechanical stripes 59-5, 59-6, 59-7, 59-8 in order from the top (in the figure) in the die; the third die 50-3 contains the mechanical stripes 59-9, 59-10, 59-11, 59-12 in order from the top (in the figure); and the right-hand die 50-4 contains the mechanical stripes 59-13, 59-14, 59-15, 59-16 in order from the top (in the figure) of the die. In the first stage of exposure (FIG. 19(A)), no pattern portions are transferred to any of the dies 50-1, 50-2, 50-3, 50-4.

In the second stage (FIG. 19(B)), the pattern portion A defined on the reticle 10-1 is transferred to the mechanical stripe 59-1 of the die 50-1, according to the scanning path 65 of the reticle stage 11. Next, the pattern portion A defined on the reticle 10-2 is transferred to the mechanical stripe 59-5 of the die 50-2. Subsequently, transfer proceeds in sequence, according to the scanning path 65, resulting in transfer of the pattern portions A, B, C, D defined on the reticle 10-1 to respective mechanical stripes 59-1, 59-2, 59-3, 59-4 of the die 50-1, and pattern portions A, B, C, D defined on the reticle 10-2 to respective mechanical stripes 59-5, 59-6, 59-7, 59-8 of the die 50-2.

In the third stage (FIG. 19(C)), the pattern portion A defined on the reticle 10-1 is transferred to the mechanical stripe 59-9 of the die 50-3, according to the scanning path 65 of the reticle stage 11. Next, the pattern portion A defined on the reticle 10-2 is transferred to the mechanical stripe 59-13 of the die 504. Subsequently, transfer proceeds in sequence, according to the scanning path 64, resulting in transfer of the pattern portions A, B, C, D defined on the reticle 10-1 to respective mechanical stripes 59-9, 59-10, 59-11, 59-12 of the die 50-3, and pattern portions A, B, C, D defined on the reticle 10-2 to respective mechanical stripes 59-13, 59-14, 59-15, 59-16 of the die 50-4.

To expose the remainder of the substrate 23, exposure continues in a manner as described above for each group of four dies. By performing substrate exposure in this manner, the number of turnarounds of the reticle stage is reduced, which correspondingly improves throughput.

Tenth Representative Embodiment

Figure 20:
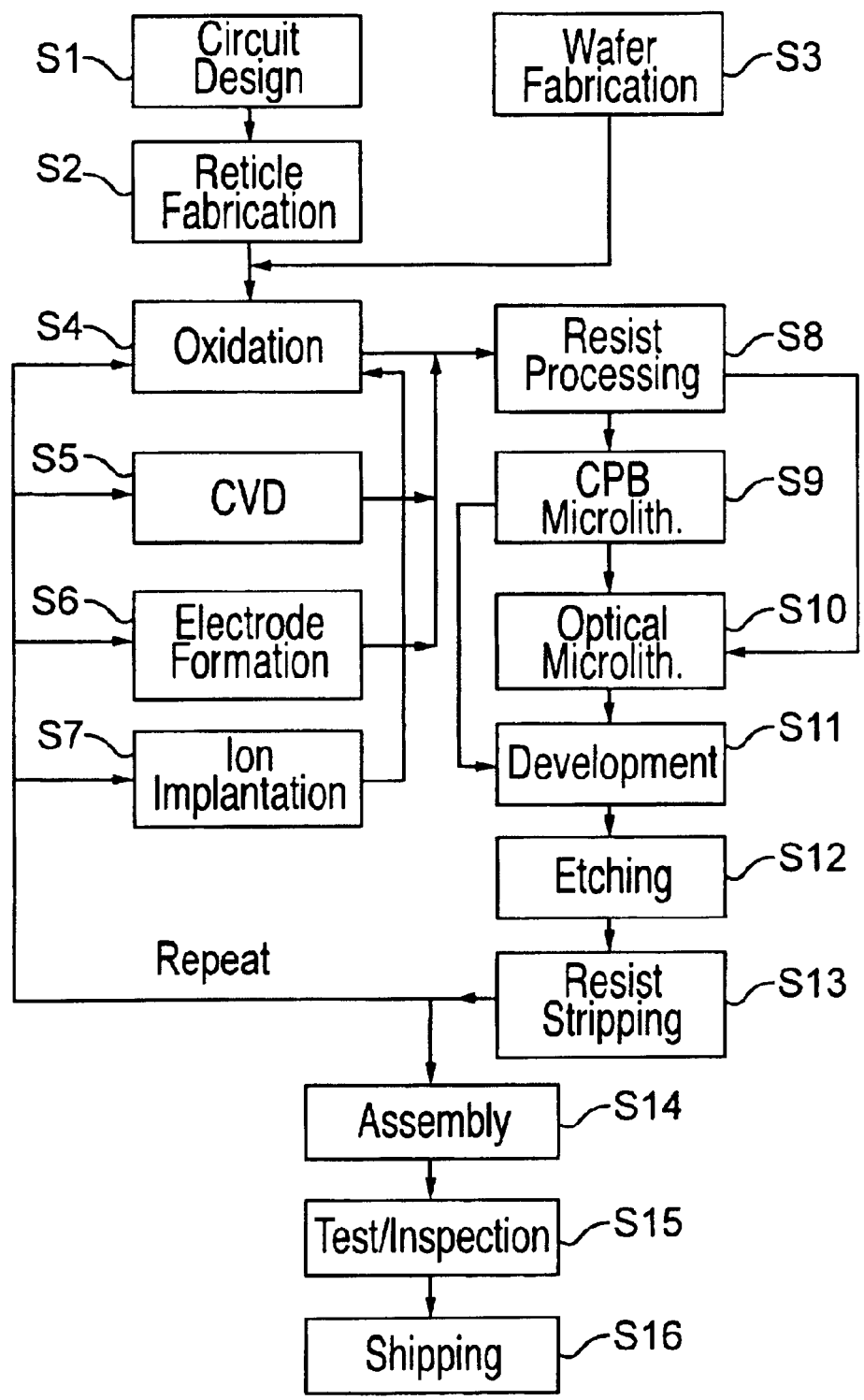

This embodiment is directed to an exemplary method for manufacturing a microelectronic device (e.g., semiconductor integrated circuit such as an LSI chip, display panel such as a LCD panel, image detector such as a CCD, thin-film magnetic head, or micromachine). The method includes any of the microlithography methods or apparatus as described above. A flow chart of the method is shown in FIG. 20.

In step S1 (circuit design), the circuit for the device is designed. In step S2, step S2 (reticle fabrication), the reticle(s) for the circuit is fabricated. During fabrication of the reticle(s), selected pattern elements can be locally resized as required to reduce or compensate for beam blur caused by proximity effects and the space-charge effects. In step S3 (wafer fabrication), a wafer or other suitable substrate is fabricated from a material such as silicon.

S4–S13 are directed to wafer-processing steps, specifically "pre-process" steps. In the pre-process steps, the circuit pattern defined on the reticle(s) is transferred onto the substrate by microlithography. Specifically, step S4 is an oxidation step for oxidizing the surface of the substrate. Step S5 involves chemical vapor deposition (CVD) for forming an insulating layer on the substrate surface. Step S6 is an electrode-formation step for forming electrodes on the substrate.

(typically by vapor deposition). Step S7 is an ion-implantation step for implanting ions (e.g., dopant ions) into the substrate. Step S8 (resist processing) involves application of a "resist" (i.e., exposure-sensitive material) to the substrate. Step S9 (CPB microlithography) involves microlithographically exposing the circuit pattern, defined on the reticle(s) made in step S2, onto the layer of resist on the substrate, using a charged particle beam and a CPB-microlithography apparatus and methods as described herein. Step S10 (optical microlithography) involves microlithographically exposing a circuit pattern, defined on a reticle such as that fabricated in step S2, onto a layer of resist on the substrate using an optical "stepper." Before or after this step, exposure(s) can be made to correct proximity effects. Step S11 involves developing the exposed resist on the substrate. Step S12 involves etching the substrate to remove material selectively from areas where developed resist is absent. Step S13 involves resist stripping, in which remaining resist on the substrate is removed after the etching step. By repeating steps S4–S13 as required, circuit patterns as defined by successive reticles are formed superposedly on each die on the substrate.

Step S14 is an assembly step (also termed a "post-process" step) in which the substrate that has passed through steps S4–S13 is formed into "chips" each corresponding to a microelectronic device. This step can include, e.g., assembling the devices (dicing and bonding) and packaging (encapsulation of individual devices). Step S15 is an inspection step in which any of various operability, qualification, and endurance tests of the devices produced in step S14 are conducted. Afterward, devices that successfully pass step S15 are finished, packaged, and shipped (step S16).

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A charged-particle-beam (CPB) microlithography apparatus, comprising:

a reticle stage configured to hold a reticle defining a pattern and divided into multiple subfields each defining a respective portion of the pattern, at least some of the subfields being grouped on the reticle so as to form first and second stripes that are mutually complementary to each other, wherein the first and second mutually complementary stripes are arranged on the reticle with an intervening stripe being situated between the first and second complementary stripes;

an illumination-optical system situated upstream of the reticle stage and configured to direct an illumination beam at a location on the reticle so as to produce a charged-particle patterned beam from particles of the illumination beam passing through the illuminated location on the reticle;

a projection-optical system situated downstream of the reticle stage and configured to direct the patterned beam from the reticle onto a region of the sensitive substrate corresponding to the illuminated region of the reticle;

a substrate stage situated downstream of the projection-optical system and configured to provide a surface on which the sensitive substrate is mounted for exposure; and a controller connected to and configured to control operation of the reticle stage, the substrate stage, the illumination-optical system and the projection-optical system during exposure of the pattern from the reticle to the sensitive substrate, the controller being further configured to expose the first and second mutually complementary stripes in a sequential manner onto the sensitive substrate.

2. The apparatus of claim 1, wherein:

the reticle stage is configured to move, during illumination of a stripe, in a respective scanning direction; and the controller is configured to move the reticle stage, during the sequential exposure of the first and second mutually complementary stripes, in the same scanning direction.

3. A charged-particle-beam (CPB) microlithography apparatus, comprising:

multiple reticle stages each configured to hold a respective reticle defining a respective portion of a pattern to be transferred to a sensitive substrate, each reticle being subdivided into multiple respective subfields of the respective pattern portion and each subfield defining a respective sub-portion of the pattern;

an illumination-optical system situated upstream of the reticle stages and configured to direct an illumination beam at a location on a selected reticle held by the respective reticle stage so as to produce a charged-particle patterned beam from particles of the illumination beam passing through the illuminated location on the selected reticle;

a projection-optical system situated downstream of the reticle stages and configured to direct the patterned beam from the selected reticle onto a region of the sensitive substrate corresponding to the illuminated region of the selected reticle;

a substrate stage situated downstream of the projection-optical system and configured to provide a surface on which the sensitive substrate is mounted for exposure; and a controller connected to and configured to control operation of the reticle stages, the substrate stage, the illumination-optical system, and the projection-optical system during exposure of the pattern from the reticles to the sensitive substrate, the controller being further configured to expose the respective pattern portion, defined by the selected reticle, onto all chips on the sensitive substrate and then to select a subsequent reticle for exposure onto all chips on the sensitive substrate.

4. A charged-particle-beam (CPB) microlithography apparatus, comprising:

multiple reticle stages each configured to hold a respective reticle defining a respective portion of a pattern to be transferred to a sensitive substrate, each reticle being subdivided into multiple respective subfields of the respective pattern portion and each subfield defining a respective sub-portion of the pattern;

an illumination-optical system situated upstream of the reticle stages and configured to direct an illumination beam at a location on a selected reticle held by the respective reticle stage so as to produce a charged-particle patterned beam from particles of the illumination beam passing through the illuminated location on the selected reticle;

a projection-optical system situated downstream of the reticle stages and configured to direct the patterned beam from the selected reticle onto a region of the sensitive substrate corresponding to the illuminated region of the selected reticle;

a substrate stage situated downstream of the projection-optical system and configured to provide a surface on which the sensitive substrate is mounted for exposure; and a controller connected to and configured to control operation of the reticle stages, the substrate stage, the illumination-optical system, and the projection-optical system during exposure of the pattern from the reticles to the sensitive substrate, the controller being further configured to expose all the respective pattern portions, defined by the multiple reticles, in a sequential manner onto one chip on the sensitive substrate and then progressing to a subsequent chip that is exposed in a similar manner.

5. A charged-particle-beam (CPB) microlithography apparatus, comprising:

a reticle stage configured to hold a first and a second reticle each defining a respective complementary portion (X, X', respectively) of a pattern to be transferred to a sensitive substrate, each reticle being subdivided into multiple respective subfields of the respective pattern portion and each subfield defining a respective sub-portion of the pattern;

an illumination-optical system situated upstream of the reticle stage and configured to direct an illumination beam at a location on a selected reticle held by the respective reticle stage so as to produce a charged-particle patterned beam from particles of the illumination beam passing through the illuminated location on the selected reticle;

a projection-optical system situated downstream of the reticle stage and configured to direct the patterned beam from the selected reticle onto a region of the sensitive substrate corresponding to the illuminated region of the selected reticle;

a substrate stage situated downstream of the projection-optical system and configured to provide a surface on which the sensitive substrate is mounted for exposure; and a controller connected to and configured to control operation of the reticle stage, the substrate stage, the illumination-optical system, and the projection-optical system during exposure of the pattern from the reticles to the sensitive substrate, the controller being further configured to expose the respective complementary pattern portions X, X' in a sequential manner while scanning the reticle stage in a same direction for each complementary pattern portion.

6. The apparatus of claim 5, wherein the controller is configured to expose the respective complementary pattern portions X, X' sequentially onto separate chips on the sensitive substrate.

7. A charged-particle-beam (CPB) microlithography apparatus, comprising:

multiple reticle stages each configured to hold a respective reticle defining a pattern to be transferred to a sensitive substrate, each reticle being subdivided into multiple respective subfields and each subfield defining a respective sub-portion of the pattern;

an illumination-optical system situated upstream of the reticle stages and configured to direct an illumination beam at a location on a selected reticle held by the respective reticle stage so as to produce a charged-particle patterned beam from particles of the illumination beam passing through the illuminated location on the selected reticle;

a projection-optical system situated downstream of the reticle stages and configured to direct the patterned beam from the selected reticle onto a region of the sensitive substrate corresponding to the illuminated region of the selected reticle;

a substrate stage situated downstream of the projection-optical system and configured to provide a surface on which the sensitive substrate is mounted for exposure; and a controller connected to and configured to control operation of the reticle stages, the substrate stage, the illumination-optical system, and the projection-optical system during exposure of the pattern from the reticles to the sensitive substrate, the controller being further configured to expose the pattern defined by the reticles in a sequential manner on separate chips on the sensitive substrate.

8. A process for manufacturing a microelectronic device, comprising processing a substrate to form a pattern, for the microelectronic device, on the substrate, wherein processing includes performing a microlithography method utilizing a CPB microlithography apparatus as recited in claim 1.

9. A process for manufacturing a microelectronic device, comprising processing a substrate to form a pattern, for the microelectronic device, on the substrate, wherein processing includes performing a microlithography method utilizing a CPB microlithography apparatus as recited in claim 3.

10. A process for manufacturing a microelectronic device, comprising processing a substrate to form a pattern, for the microelectronic device, on the substrate, wherein processing includes performing a microlithography method utilizing a CPB microlithography apparatus as recited in claim 4.

11. A process for manufacturing a microelectronic device, comprising processing a substrate to form a pattern, for the microelectronic device, on the substrate, wherein processing includes performing a microlithography method utilizing a CPB microlithography apparatus as recited in claim 5.

12. A process for manufacturing a microelectronic device, comprising processing a substrate to form a pattern, for the microelectronic device, on the substrate, wherein processing includes performing a microlithography method utilizing a CPB microlithography apparatus as recited in claim 7.

13. A charged-particle-beam (CPB) microlithography apparatus, comprising:
- a reticle stage configured to hold a reticle defining a pattern and divided into multiple subfields each defining a respective portion of the pattern, at least some of the subfields being grouped on the reticle so as to form first and second stripes that are mutually complementary to each other, wherein the first and second mutually complementary stripes are electrical stripes that are arranged adjacent each other in a mechanical stripe;
- an illumination-optical system situated upstream of the reticle stage and configured to direct an illumination beam at a location on the reticle so as to produce a charged-particle patterned beam from particles of the illumination beam passing through the illuminated location on the reticle;
- a projection-optical system situated downstream of the reticle stage and configured to direct the patterned beam from the reticle onto a region of the sensitive substrate corresponding to the illuminated region of the reticle;
- a substrate stage situated downstream of the projection-optical system and configured to provide a surface on which the sensitive substrate is mounted for exposure; and
- a controller connected to and configured to control operation of the reticle stage, the substrate stage, the illumination-optical system and the projection-optical system during exposure of the pattern from the reticle to the sensitive substrate, the controller being further configured to expose the first and second mutually complementary stripes in a sequential manner onto the sensitive substrate.

14. The apparatus of claim 13, wherein:
the reticle stage is configured to move, during illumination of a stripe, in a respective scanning direction; and
the controller is configured to move the reticle stage, during the sequential exposure of the first and second mutually complementary stripes, in the same scanning direction.

15. A process for manufacturing a microelectronic device, comprising processing a substrate to form a pattern, for the microelectronic device, on the substrate, wherein processing includes performing a microlithography method utilizing a CPB microlithography apparatus as recited in claim 13.

16. A charged-particle-beam (CPB) microlithography apparatus, comprising:
- a reticle stage configured to hold a reticle defining a pattern and divided into multiple subfields each defining a respective portion of the pattern, at least some of the subfields being grouped on the reticle so as to form first and second stripes that are mutually complementary to each other, wherein the first and second mutually complementary stripes are electrical stripes that are arranged in a mechanical stripe on the reticle with an intervening stripe situated between the first and second complementary stripes in the mechanical stripe;
- an illumination-optical system situated upstream of the reticle stage and configured to direct an illumination beam at a location on the reticle so as to produce a charged-particle patterned beam from particles of the illumination beam passing through the illuminated location on the reticle;
- a projection-optical system situated downstream of the reticle stage and configured to direct the patterned beam from the reticle onto a region of the sensitive substrate corresponding to the illuminated region of the reticle;
- a substrate stage situated downstream of the projection-optical system and configured to provide a surface on which the sensitive substrate is mounted for exposure; and
- a controller connected to and configured to control operation of the reticle stage, the substrate stage, the illumination-optical system and the projection-optical system during exposure of the pattern from the reticle to the sensitive substrate, the controller being further configured to expose the first and second mutually complementary stripes in a sequential manner onto the sensitive substrate.

17. The apparatus of claim 16, wherein:
the reticle stage is configured to move, during illumination of a stripe, in a respective scanning direction; and
the controller is configured to move the reticle stage, during the sequential exposure of the first and second mutually complementary stripes, in the same scanning direction.

18. A process for manufacturing a microelectronic device, comprising processing a substrate to form a pattern, for the microelectronic device, on the substrate, wherein processing includes performing a microlithography method utilizing a CPB microlithography apparatus as recited in claim 16.

* * * * *

UNITED STATES PATENT AND TRADEMARK OFFICE
CERTIFICATE OF CORRECTION

| | | |
|---|---|---|
| PATENT NO. | : 6,936,831 B2 | Page 1 of 2 |
| APPLICATION NO. | : 09/860958 | |
| DATED | : August 30, 2005 | |
| INVENTOR(S) | : Fujiwara et al. | |

It is certified that error appears in the above-identified patent and that said Letters Patent is hereby corrected as shown below:

Column 8,
Lines 33-34, "apparatus a reticle stage," should be --apparatus comprises a reticle stage,--.

Column 10,
Line 18, "portions, 110 as described" should be --portion, as described--.

Column 11,
Line 61, "to as to" should be --so as to--.

Column 16,
Line 45, "$2(D_{CW}D_{SW})=N_S$" should be --$2(D_{CW}/D_{SW})=N_S$--.

Column 17,
Line 48, "stripe 594." should be --stripe 59-4.--.

Column 19,
Line 33, "to 494," should be --to 49-4,--.

Column 20,
Line 66, "and 44-4," should be --and 42-4,--.

Column 22,
Line 13, "stripe 491 of" should be --stripe 49-1 of--.

Column 23,
Line 8, "and 494." should be --and 49-4.--.

Column 24,
Line 3, ", 494 defining" should be --, 49-4 defining--.
Line 22, "reticles 101," should be --reticles 10-1,--.
Line 59, "die 504." should be --die 50-4.--.

UNITED STATES PATENT AND TRADEMARK OFFICE
CERTIFICATE OF CORRECTION

PATENT NO.        : 6,936,831 B2
APPLICATION NO. : 09/860958
DATED             : August 30, 2005
INVENTOR(S)       : Fujiwara et al.

It is certified that error appears in the above-identified patent and that said Letters Patent is hereby corrected as shown below:

Column 25,
Line 14, "In step S2, step S2" should be --In step S2--.
Line 21, "S4-S13" should be --Steps S4-S13--.
Lines 29-30, "substrate.  (typically by vapor deposition)." should be --substrate (typically by vapor deposition).--.

Signed and Sealed this

Twenty-fifth Day of September, 2007

JON W. DUDAS
*Director of the United States Patent and Trademark Office*